United States Patent
Takada et al.

(10) Patent No.: US 6,927,884 B2
(45) Date of Patent: Aug. 9, 2005

(54) SOLID-STATE IMAGE SENSING DEVICE

(75) Inventors: Kenji Takada, Itami (JP); Yoshio Hagihara, Yokohama (JP)

(73) Assignee: Minolta Co., Ltd., Osaka (JP)

( * ) Notice: Subject to any disclaimer, the term of this patent is extended or adjusted under 35 U.S.C. 154(b) by 899 days.

(21) Appl. No.: 09/922,763

(22) Filed: Aug. 6, 2001

(65) Prior Publication Data

US 2002/0054389 A1 May 9, 2002

(30) Foreign Application Priority Data

Aug. 31, 2000 (JP) .................................. 2000-264059

(51) Int. Cl.[7] .............................................. H04N 1/04
(52) U.S. Cl. ...................... 358/513; 358/482; 358/483; 348/229.1; 348/308; 250/208.1
(58) Field of Search .................. 358/513, 509, 358/520, 475, 482, 483; 348/229.1, 308, 230.1, 294, 302, 307; 250/208.1, 214

(56) References Cited

U.S. PATENT DOCUMENTS

| | | | |
|---|---|---|---|
| 4,636,865 A | * 1/1987 | Imai | 348/307 |
| 5,241,575 A | 8/1993 | Miyatake et al. | 377/60 |
| 5,401,952 A | * 3/1995 | Sugawa | 250/208.1 |
| 5,861,621 A | * 1/1999 | Takebe et al. | 250/214 R |
| 6,163,023 A | * 12/2000 | Watanabe | 250/208.1 |
| 6,677,993 B1 | * 1/2004 | Suzuki et al. | 348/241 |
| 2004/0065803 A1 | 4/2004 | Kakumoto | |

FOREIGN PATENT DOCUMENTS

| | | |
|---|---|---|
| JP | 10-090058 A | 4/1998 |
| JP | 11-313257 A | 11/1999 |
| JP | 2000-196961 A | 7/2000 |
| JP | 2000-329616 A | 11/2000 |
| JP | 2001-008111 A | 1/2001 |
| JP | 2001-036817 A | 2/2001 |
| JP | 2001-218112 A | 8/2001 |
| JP | 2001-268442 A | 9/2001 |

* cited by examiner

Primary Examiner—Kimberly Williams
Assistant Examiner—Negussie Worku
(74) Attorney, Agent, or Firm—Sidley Austin Brown & Wood LLP

(57) ABSTRACT

A solid-state image-sensing device has a photosensitive element that produces an electric signal commensurate with the amount of light incident thereon, a transistor of which the first electrode and the control electrode are connected to one electrode of the photosensitive element, and a resetting portion for resetting the transistor by feeding a predetermined pulse signal to the second electrode of the transistor. The resetting portion resets the transistor in such a way as to inhibit the transistor from operating in a subthreshold region when the amount of light incident on the photosensitive element is below a predetermined level.

41 Claims, 33 Drawing Sheets

SOLID-STATE IMAGE SENSING DEVICE

This application is based on Japanese Patent Application No. 2000-264059 filed on Aug. 31, 2000, the contents of which are hereby incorporated by reference.

BACKGROUND OF THE INVENTION

1. Field of the Invention

The present invention relates to a solid-state image-sensing device that is switchable between a first state in which it outputs an electric signal that is linearly proportional to the amount of incident light and a second state in which it outputs an electric signal that is natural-logarithmically proportional to the amount of incident light.

2. Description of the Prior Art

Conventional solid-state image-sensing devices are grouped roughly into CCD-type and MOS-type according to the means by which they read out photoelectric charge generated in photoelectric conversion elements. CCD-type image-sensing devices transfer electric charge while accumulating it in potential wells. On the other hand, MOS-type image-sensing devices read out electric charge accumulated in the pn junction capacitance of photodiodes through MOS transistors. However, these conventional solid-state image-sensing devices yield outputs that are proportional to the amount of electric charge generated, and thus have the disadvantage of narrow dynamic ranges.

To obtain a wider dynamic range, a solid-state image-sensing device has been proposed that is provided with a photosensitive means that produces a photocurrent commensurate with the amount of incident light, a MOS transistor to which the photocurrent is fed, and a bias means that biases the MOS transistor in such a way that a subthreshold current flows therethrough. This solid-state image-sensing device outputs an electric signal that is natural-logarithmically proportional to the amount of incident light. This type of solid-state image-sensing device has a wide dynamic range, but has the disadvantages of unsatisfactory characteristics in low-brightness condition and an insufficient SIN (signal-to-noise) ratio.

On the other hand, an optical sensor circuit has also been proposed that is provided with a photosensitive means that produces a photocurrent commensurate with the amount of incident light and a MOS transistor to which the photocurrent is fed; in addition, this optical sensor circuit is so configured as to be switchable between a first state in which it yields an output linearly proportional to the photocurrent and a second state in which it yields an output natural-logarithmically proportional to the photocurrent (U.S. Pat. No. 5,861,621).

In this optical sensor circuit, proposed in U.S. Pat. No. 5,861,621, that can be switched between linear conversion and logarithmic conversion, a node between a photodiode and a capacitor is reset by making the gate voltage of a MOS transistor sufficiently higher than the drain voltage thereof so that the drain-source channel of the MOS transistor is brought into a low-impedance state. This makes the potential at the source substantially equal to the potential at the drain. As a result, where a plurality of such circuits are provided, the node between the photodiode and the capacitor is reset in such a way that the voltage there becomes identical in all the circuits. That is, the variations in sensitivity among the individual circuits due to the variations in the threshold voltage of their MOS transistors are not reflected in the outputs from those circuits. This causes the switching point between linear conversion and logarithmic conversion to vary from one pixel to another.

SUMMARY OF THE INVENTION

An object of the present invention is to provide a novel and effective solid-state image-sensing device that can be switched between logarithmic conversion and linear conversion automatically according to the amount of light incident on the photoelectric conversion portion thereof.

Another object of the present invention is to provide a solid-state image-sensing device that has a plurality of pixels and in which the switching point between linear conversion and logarithmic conversion is substantially identical in all pixels.

To achieve the above objects, according to one aspect of the present invention, a solid-state image-sensing device is provided with: a photosensitive element that produces an electric signal commensurate with the amount of light incident thereon; a transistor of which the first electrode and the control electrode are connected to one electrode of the photosensitive element; and a resetting portion for resetting the transistor by feeding a predetermined pulse signal to the second electrode of the transistor. Here, the resetting portion resets the transistor in such a way as to inhibit the transistor from operating in a subthreshold region when the amount of light incident on the photosensitive element is below a predetermined level.

Alternatively, according to another aspect of the present invention, in a solid-state image-sensing device as described above, the resetting portion resets the transistor in such a way as to, on the one hand, keep the transistor in a cut-off state when the amount of light incident on the photosensitive element is below a predetermined level so that an output linearly proportional to the amount of light incident on the photosensitive element appears at the control electrode of the transistor and, on the other hand, permit the transistor to operate in a subthreshold region when the amount of light incident on the photosensitive element is equal to or above the predetermined level so that an output logarithmically proportional to the amount of light incident on the photosensitive element appears at the control electrode of the transistor.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
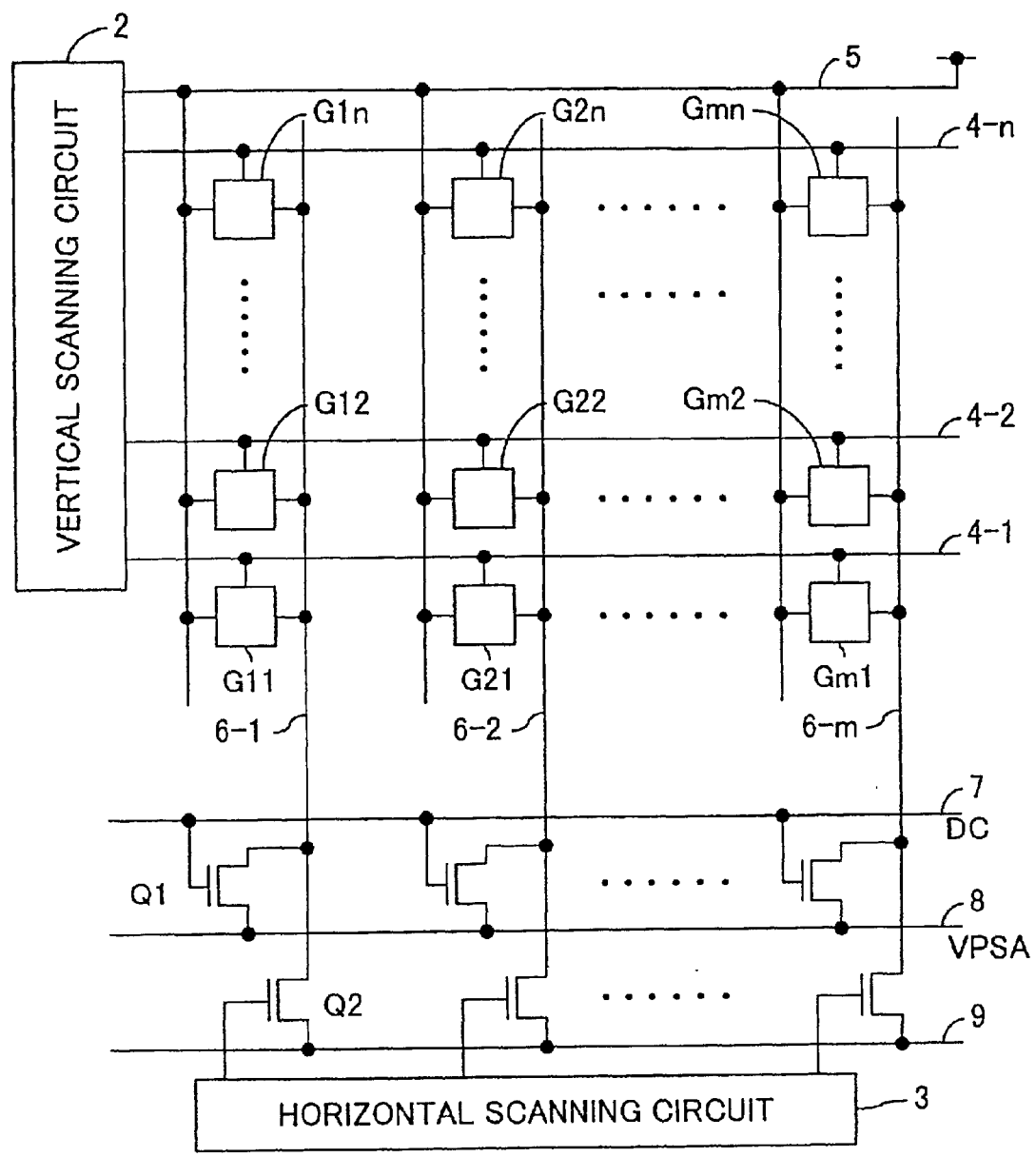
FIG. 1 is a block diagram illustrating the overall configuration of a two-dimensional solid-state image-sensing device embodying the invention.

FIG. 1 schematically shows the configuration of a portion of a two-dimensional MOS-type solid-state image-sensing device embodying the invention. In this figure, reference symbols G11 to Gmn represent pixels arranged in rows and columns (in a matrix). Reference numeral 2 represents a vertical scanning circuit, which scans rows (lines) 4-1, 4-2, ..., 4-n sequentially. Reference numeral 3 represents a horizontal scanning circuit, which reads out photoelectric conversion signals, which are delivered from the pixels to output signal lines 6-1, 6-2, ..., 6-m, sequentially pixel by pixel in the horizontal direction. Reference numeral 5 represents a power line. In reality, the individual pixels are connected not only to the lines 4-1, 4-2, ..., 4-n, the output signal lines 6-1, 6-2, ..., 6-m, and the power line 5 mentioned above, but also to other lines (for example, clock lines and bias supply lines); however, these other lines are omitted in FIG. 1.

As shown in the figure, for each of the output signal lines 6-1, 6-2, ..., 6-m, there is provided a pair of N-channel MOS transistors Q1 and Q2. Here, a description will be given only with respect to the output signal line 6-1 as a representative. The MOS transistor Q1 has its gate connected to a direct-current voltage line 7, has its drain connected to the output signal line 6-1, and has its source connected to a line 8 of a direct-current voltage VPSA. On the other hand, the MOS transistor Q2 has its drain connected to the output signal line 6-1, has its source connected to a signal line 9 serving as a final destination line, and has its gate connected to the horizontal scanning circuit 3.

As will be described later, the pixels G11 to Gmn are each provided with an N-channel MOS transistor Ta that outputs a signal based on the photoelectric charge that has been generated therein. This MOS transistor Ta and the MOS transistor Q1 described above are interconnected as shown in FIG. 2A. The MOS transistor Ta corresponds to the MOS transistor T4 in the second to fourth, sixth to eighth, tenth, and eleventh embodiments, and to the MOS transistor T2 in the first, fifth, and ninth embodiments. Here, the direct-current a voltage VPSA connected to the source of the MOS transistor Q1 and a direct-current voltage VPDA connected to the drain of the MOS transistor Ta fulfill the relation VPDA>VPSA, where VPSA equals, for example, the ground voltage. In this circuit configuration, the upper-stage MOS transistor Ta receives a signal at its gate, and the lower-stage MOS transistor Q1 receives a direct-current voltage DC at its gate all the time. Hence, the lower-stage MOS transistor Q1 is equivalent to a resistor or constant-current source, and thus the circuit shown in FIG. 2A acts as an amplifier circuit of a source follower type. In this case, it can safely be said that the amplification performed by the MOS transistor Ta yields a current as its output.

The MOS transistor Q2 is controlled by the horizontal scanning circuit 3 so as to act as a switching device. As will be described later, in all the embodiments shown in FIG. 3 and the subsequent figures, each pixel is further provided with an N-channel MOS transistor T3 that acts as a switch. If this MOS transistor T3 is illustrated explicitly, the circuit shown in FIG. 2A has a configuration as shown in FIG. 2B. Specifically, the MOS transistor T3 is inserted between the MOS transistor Q1 and the MOS transistor Ta. Here, the MOS transistor T3 serves to select a row, and the MOS transistor Q2 serves to select a column. The circuit configurations shown in FIGS. 1, 2A, and 2B are common to all of the first to eleventh embodiments described below.

Figure 2A:
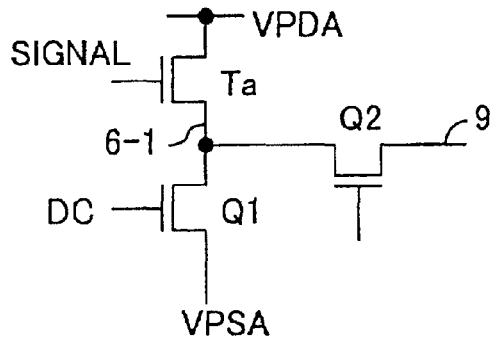
FIGS. 2A and 2B are diagrams showing a portion of FIG. 1.
Figure 2B:
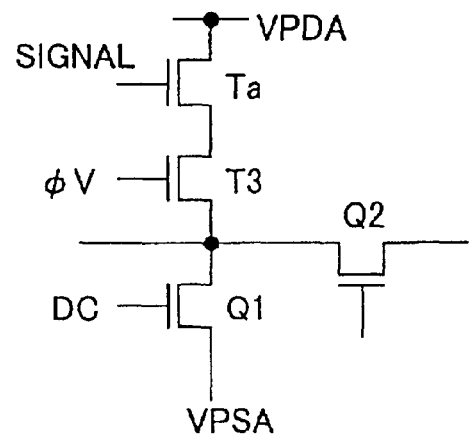

With the circuit configuration shown in FIGS. 2A and 2B, it is possible to output signals at a high gain. As a result, even in cases where photocurrents generated in photosensitive elements are converted natural-logarithmically to obtain a wide dynamic range, and thus output signals are low if they are output as they are, the amplifier circuit described above amplifies the signals to a sufficiently high level, and thereby makes them easier to process in the signal processing circuit (not shown) in the succeeding stage. Alternatively, the MOS transistor Q1, which constitutes a load resistor in the amplifier circuit, may be provided not within each pixel, but one for each of the output signal lines 6-1, 6-2, ..., 6-m, to each of which a plurality of pixels arranged in the corresponding column are connected collectively. This helps reduce the number of load resistors or constant-current sources, and thereby reduce the area occupied by the amplifier circuit on a semiconductor chip.

First Embodiment

Figure 3:
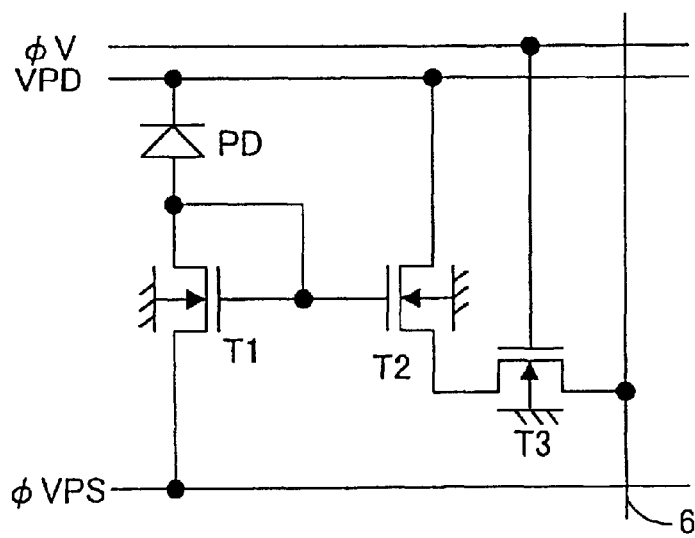
FIG. 3 is a circuit diagram showing an example of the configuration of each pixel in a first embodiment of the invention.

Now, a first embodiment of the invention, which is applicable to each pixel in the circuit configuration shown in FIG. 1, will be described with reference to the drawings. FIG. 3 is a circuit diagram showing the configuration of each pixel provided in a solid-state image-sensing device in this embodiment.

In FIG. 3, a pn photodiode PD serves as a photosensitive portion (photoelectric conversion portion). The anode of this photodiode PD is connected to the gate and drain of a MOS transistor T1 and to the gate of a MOS transistor T2. The source of the MOS transistor T2 is connected to the drain of a MOS transistor T3 for row selection. The source of the MOS transistor T3 is connected to an output signal line 6 (this output signal line 6 corresponds to the output signal lines 6-1, 6-2, ..., 6-m shown in FIG. 1). The MOS transistors T1 to T3 are all N-channel MOS transistors with their back gates grounded.

A direct-current voltage VPD is applied to the cathode of the photodiode PD and to the drain of the MOS transistor T2. A signal φVPS is fed to the source of the MOS transistor T1. A signal φV is fed to the gate of the MOS transistor T3. Here, the signal φVPS is a binary voltage signal that takes either a level VH that makes the MOS transistor T1 operate in a subthreshold region when the amount of incident light is above a predetermined level or a level VL that is lower than the level VH and brings the MOS transistor T1 into a conducting state. This pixel configured as described above operates in the following manner.

Figure 4:
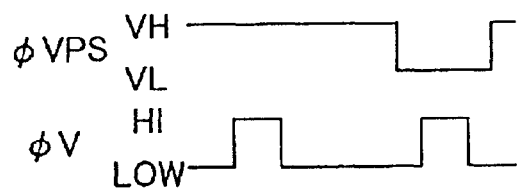
FIG. 4 is a timing chart showing the operation of each pixel in the first embodiment.

As shown in a timing chart in FIG. 4, when a pulse is fed as the signal φV to the gate of the MOS transistor T3, an output signal is read out. Then, the signal φVPS is turned to the level VL to perform a resetting operation. Here, electric charge of the opposite polarity to the electric charge that has been accumulated between the source and drain of the MOS transistor T1 flows into the MOS transistor T1 through the MOS transistor Ti, and thereby the gate voltage of the MOS transistor T1 is reset.

While the signal φVPS is kept at the level VL to perform the resetting operation in this way, a high-level pulse is fed as the signal φV to the gate of the MOS transistor T3 to read out a noise signal obtained during the resetting operation. Here, the gate voltage of the MOS transistor T1 in its reset state is fed to the gate of the MOS transistor T2. As a result, the gate voltage of the MOS transistor T1 is current-amplified by the MOS transistor T2, and is then delivered through the MOS transistor T3 to the output signal line 6.

Moreover, the drain voltage of the MOS transistor Q1, which is determined by the on-state resistances of the MOS transistor T2 and the MOS transistor Q1 (FIG. 2) and the current flowing therethrough, appears as a noise signal on the output signal line 6. After the noise signal is read out in this way, the MOS transistor T3 is turned off, and then the signal φVPS is turned to the level VH in preparation for an image-sensing operation that is to follow.

When the signal φVPS is turned to the level VH, the image-sensing operation is started, and an amount of photoelectric charge commensurate with the amount of incident light flows from the photodiode PD into the MOS transistor Ti. The MOS transistor T1 is now in a cut-off state, and therefore the photoelectric charge is accumulated at the gate of the MOS transistor T1. Accordingly, when the brightness of the subject being sensed is low, and thus the amount of light incident on the photodiode PD is small, a voltage commensurate with the amount of photoelectric charge accumulated at the gate of the MOS transistor T1 appears at the gate of the MOS transistor T1. As a result, a voltage linearly proportional to the integral of the amount of incident light appears at the gate of the MOS transistor T1.

By contrast, when the brightness of the subject being sensed is high, and thus the amount of light incident on the photodiode PD is large, the voltage commensurate with the amount of photoelectric charge accumulated at the gate of the MOS transistor T1 is high. This causes the MOS transistor T1 to operate in a subthreshold region. As a result, a voltage natural-logarithmically proportional to the amount of incident light appears at the gate of the MOS transistor T1.

In this way, a voltage linearly or natural-logarithmically proportional to the amount of incident light appears at the gates of the MOS transistors T1 and T2. Then, in the same manner as described above, a pulse is fed as the signal φV to the gate of the MOS transistor T3, so that the gate voltage of the MOS transistor T1, which is linearly or natural-logarithmically proportional to the amount of incident light, is current-amplified by the MOS transistor T2, and is then delivered through the MOS transistor T3 to the output signal line 6. Moreover, the drain voltage of the MOS transistor Q1, which is determined by the on-state resistances of the MOS transistor T2 and the MOS transistor Q1 and the current flowing therethrough, appears as an image signal on the output signal line 6.

Among the individual pixels each operating as described above, the threshold voltage of the MOS transistor T1 varies from one pixel to another, and therefore, when the signal φVPS is at the level VH, the voltage at which a switching from linear conversion to logarithmic conversion takes place is $VH+V_{TH}-K$ (where $V_{TH}$ represents the threshold voltage of the MOS transistor T1 and K represents a constant). In this embodiment, when the signal φVPS is at the level VL, the voltage at the gate electrode of the MOS transistor T1 is substantially equal to $VL+V_{TH}$ in practical terms. Thus, the difference is $\Delta V=VH-VL-K$; that is, the amount of electric charge that is required to effect a transition from a reset state to the aforementioned switching point is substantially constant irrespective of variations in the threshold voltage of the MOS transistor T1 among the individual pixels.

Therefore, the amount of photoelectric charge that flows into the MOS transistor T1 before the gate voltage of the MOS transistor T1 reaches the voltage at which a switching to logarithmic conversion takes place is equal in all the pixels. Thus, the amount of electric charge that is generated in the photodiode PD when a switching to logarithmic conversion takes place is equal in all the pixels, and therefore the amount of light incident on the photodiode PD when a switching to logarithmic conversion takes place is equal in all the pixels. That is, in all the pixels, the brightness of the subject at which a switching from linear conversion to logarithmic conversion takes place is equal. In this way, it is possible to reduce the effect of variations in the threshold voltage of the MOS transistor T1 among the individual pixels on their switching from one type of conversion to another.

By varying the level VL of the signal φVPS in the resetting operation, it is possible to vary the range in which the gate voltage VG of the MOS transistor T1 is allowed to vary in linear conversion. Thus, by varying the level VL of the signal φVPS in the resetting operation, it is possible to set the switching point, which corresponds to the brightness of the subject at which a switching from linear conversion to logarithmic conversion takes place in the individual pixels, at the desired level.

Figure 50:
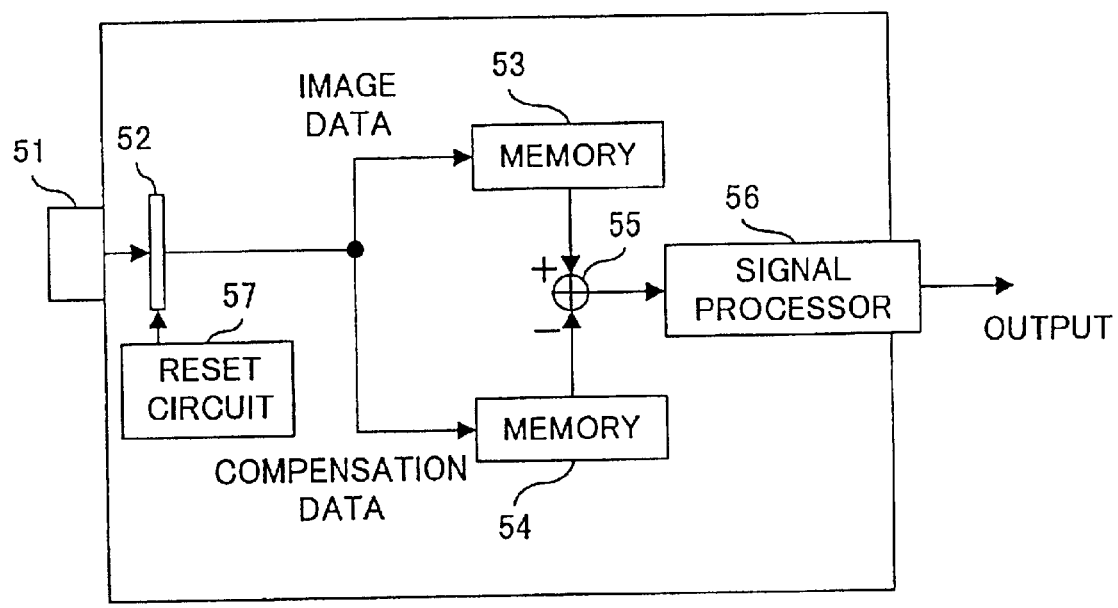
FIG. 50 is a block diagram showing the internal configuration of an image input apparatus incorporating the solid-state image-sensing device of one of the embodiments of the invention.

The noise signals from the individual pixels are fed out by way of the signal line 9 shown in FIG. 1, serially from one pixel after another, so as to be stored as pixel-by-pixel noise signals in a memory provided in the succeeding circuit. Then, the image signals from the individual pixels are corrected with the noise signals thus stored. In this way, it is possible to eliminate, from the image signals, components resulting from variations in characteristics among the individual pixels. A practical example of how this correction is achieved is shown in FIG. 50 and will be described later. Alternatively, similar correction may be realized by providing memories, such as line memories, within the pixels.

Second Embodiment

Figure 5:
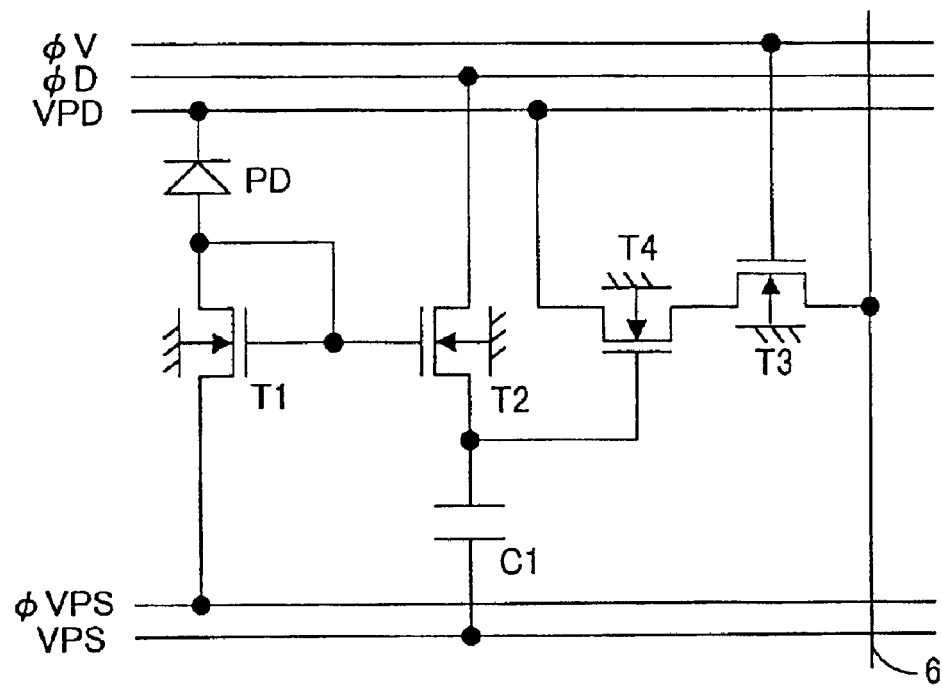
FIG. 5 is a circuit diagram showing an example of the configuration of each pixel in a second embodiment of the invention.

Now, a second embodiment of the invention will be described with reference to the drawings. FIG. 5 is a circuit diagram showing the configuration of each pixel provided in a solid-state image-sensing device in this embodiment. In the following description, such circuit elements, signal lines, etc. as serve the same purposes as in the pixel shown in FIG. 3 are identified with the same reference numerals or symbols, and their detailed explanations will not be repeated.

As shown in FIG. 5, the pixel of this embodiment is obtained by additionally providing, in the pixel of the first embodiment (FIG. 3), a capacitor C1 that has one end connected to the source of the MOS transistor T2, and a MOS transistor T4 that has its gate connected to the source of the MOS transistor T2. The MOS transistor T4 has its source connected to the drain of the MOS transistor T3, and receives the direct-current voltage VPD at its drain. Moreover, a signal φD is fed to the drain of the MOS transistor T2, and a direct-current voltage VPS is applied to the other end of the capacitor Cl. The MOS transistor T4, like the MOS transistors T1 to T3, is an N-channel MOS transistor with its back gate grounded. This pixel configured as described above operates in the following manner.

Figure 6:
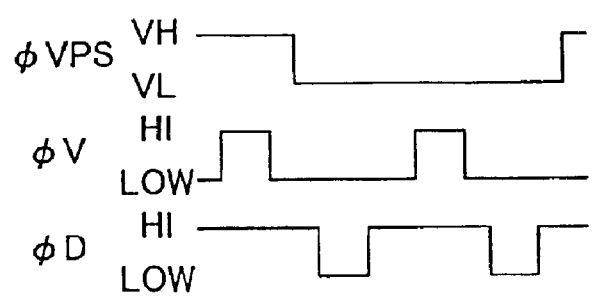
FIG. 6 is a timing chart showing the operation of each pixel in the second embodiment.

As shown in a timing chart in FIG. 6, when a pulse is fed as the signal φV to the gate of the MOS transistor T3, an output signal is read out. Then, the signal φVPS is turned to the level VL to perform a resetting operation. Here, through the MOS transistor T1, the gate voltage of the MOS transistor T1 is reset. While the signal φVPS is kept at the level VL to perform the resetting operation in this way, first, a low-level pulse is fed as the signal φD to the drain of the MOS transistor T2, so that the electric charge accumulated in the capacitor C1 is discharged through the MOS transistor T2 to the signal line of the signal φD. This initializes the voltage at the node between the capacitor C1 and the source of the MOS transistor T2.

Then, the gate voltage of the MOS transistor T1 in its reset state is fed to the gate of the MOS transistor T2, so that a current commensurate with the gate voltage of the MOS transistor T1 flows through the MOS transistor T2, as its drain current, to the capacitor C1, and thus charges the capacitor C1. As a result, the voltage at the node between the capacitor C1 and the source of the MOS transistor T2 is now commensurate with the gate voltage of the MOS transistor T1 in its reset state.

Next, a high-level pulse is fed as the signal φV to the gate of the MOS transistor T3 to read out a noise signal obtained during the resetting operation. Here, the voltage at the node between the capacitor C1 and the source of the MOS transistor T2 is fed to the MOS transistor T4, which current-amplifies it to produce an output current, which is then delivered through the MOS transistor T3 to the output signal line 6. After the noise signal obtained during the resetting operation is read out in this way, a low-level signal is fed as the signal φD to the drain of the MOS transistor T2 again to reset the voltage at the node between the capacitor C1 and the source of the MOS transistor T2. Then, the signal φVPS is turned to the level VH in preparation for an image-sensing operation.

When the signal φVPS is turned to the level VH, the image-sensing operation is started, and a voltage linearly or natural-logarithmically proportional to the amount of incident light appears at the gates of the MOS transistors T1 and T2. This voltage linearly or natural-logarithmically proportional to the amount of incident light is current-amplified by the MOS transistor T2, and the resulting current, i.e. the drain current of the MOS transistor T2, flows to the capacitor C1, and thus charges the capacitor C1. As a result, the voltage at the node between the capacitor C1 and the source of the MOS transistor T2 is now linearly or natural-logarithmically proportional to the integral of the amount of incident light.

Then, in the same manner as described above, a high-level pulse is fed as the signal φV to the gate of the MOS transistor T3 to read out an image signal obtained during the image-sensing operation. Here, the voltage at the node between the capacitor C1 and the source of the MOS transistor T2 is fed to the MOS transistor T4, which current-amplifies it to produce an output current, which is then delivered through the MOS transistor T3 to the output signal line 6. As a result, the output current thus delivered to the output signal line 6 is linearly or natural-logarithmically proportional to the integral of the amount of incident light.

While the image-sensing operation is being performed in this way, as in the first embodiment, the MOS transistor T2 receives at its gate, if the brightness is below a predetermined level, a voltage linearly proportional to the integral of the amount of incident light or, if the brightness is equal to or above the predetermined level, a voltage natural-logarithmically proportional to the integral of the amount of incident light.

With each pixel configured as described above, by varying the level VL of the signal φVPS in the resetting operation, it is possible to vary the brightness of the subject at which a switching from linear conversion to logarithmic conversion takes place in the individual pixels. Moreover, in this embodiment, the use of the capacitor C1 makes it possible to integrate the output signal before it is fed out. The capacitor C1 absorbs and eliminates, from the output signal, undesirable components such as fluctuation originating from a light source and high-frequency noise. Thus, it is possible to obtain output signals with a satisfactory S/N ratio.

The noise signals from the individual pixels are fed out by way of the signal line 9 shown in FIG. 1, serially from one pixel after another, so as to be stored as pixel-by-pixel noise signals in a memory provided in the succeeding circuit. Then, the image signals from the individual pixels are corrected with the noise signals thus stored. In this way, it is possible to eliminate, from the image signals, components resulting from variations in characteristics among the individual pixels. A practical example of how this correction is achieved is shown in FIG. 50 and will be described later. Alternatively, similar correction may be realized by providing memories, such as line memories, within the pixels.

Third Embodiment

Figure 7:
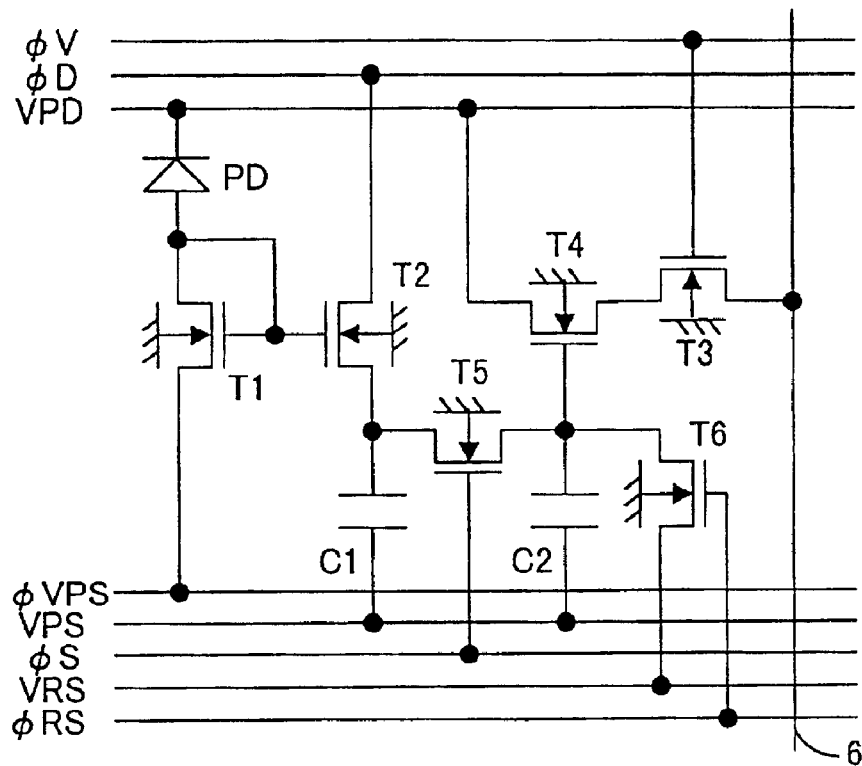
FIG. 7 is a circuit diagram showing an example of the configuration of each pixel in a third embodiment of the invention.

Now, a third embodiment of the invention will be described with reference to the drawings. FIG. 7 is a circuit diagram showing the configuration of each pixel provided in a solid-state image-sensing device in this embodiment. In the following description, such circuit elements, signal lines, etc. as serve the same purposes as in the pixel shown in FIG. 5 are identified with the same reference numerals or symbols, and their detailed explanations will not be repeated.

As shown in FIG. 7, the pixel of this embodiment is obtained by additionally providing, in the pixel of the second embodiment (FIG. 5), a MOS transistor T5 that has its drain connected to the node between the source of the MOS transistor T2 and the capacitor C1, a capacitor C2 that has one end connected to the source of the MOS transistor T5, and a MOS transistor T6 that has its drain connected to the source of the MOS transistor T5. A direct-current voltage VRS is applied to the source of the MOS transistor T6, and a signal φRS is fed to the gate of the MOS transistor T6. A signal φS is fed to the gate of the MOS transistor T5, and the voltage VPS is fed to the other end of the capacitor C2. The MOS transistors T5 and T6, like the MOS transistors T1 to T4, are N-channel MOS transistors with their back gates grounded. This pixel configured as described above operates in the following manner.

When a pulse is fed as the signal φV to the gate of the MOS transistor T3, an output signal is read out. Then, the signal φVPS is turned to the level VL to perform a resetting operation. Here, through the MOS transistor T1, the gate voltage of the MOS transistor T1 is reset. While the signal φVPS is kept at the level VL to perform the resetting operation in this way, first, a low-level pulse is fed as the signal φD to the drain of the MOS transistor T2, so that the electric charge accumulated in the capacitor C1 is discharged through the MOS transistor T2 to the signal line of the signal φD. This initializes the voltage at the node between the capacitor C1 and the source of the MOS transistor T2. Moreover, a pulse is fed in as the signal φRS to initialize the capacitor C2.

Then, the gate voltage of the MOS transistor T1 in its reset state is fed to the gate of the MOS transistor T2, so that a current commensurate with the gate voltage of the MOS transistor T1 flows through the MOS transistor T2, as its drain current, to the capacitor C1, and thus charges the capacitor C1. As a result, the voltage at the node between the capacitor C1 and the source of the MOS transistor T2 is now commensurate with the gate voltage of the MOS transistor T1 in its reset state. Then, the signal φVPS is turned to the level VH in preparation for an image-sensing operation that is to follow. The manipulation of the signals φD and φVPS here is performed simultaneously for all the pixels G11 to Gmn shown in FIG. 1.

When the signal φVPS is turned to the level VH, the image-sensing operation is started, and a voltage linearly or natural-logarithmically proportional to the amount of incident light appears at the gates of the MOS transistors T1 and T2. This voltage linearly or natural-logarithmically proportional to the amount of incident light is current-amplified by the MOS transistor T2, and the resulting current, i.e. the drain current of the MOS transistor T2, flows to the capacitor C1, and thus charges the capacitor C1. As a result, the voltage at the node between the capacitor C1 and the source of the MOS transistor T2 is now linearly or natural-logarithmically proportional to the integral of the amount of incident light.

Next, a high-level pulse is fed as the signal φS to the gate of the MOS transistor T5 to bring this MOS transistor T5 into a conducting state, so that the voltage at the node between the capacitor C1 and the source of the MOS transistor T2 is sampled by the capacitor C2. As a result, the voltage at the node between the capacitor C2 and the gate of the MOS transistor T4 is now linearly or natural-logarithmically proportional to the integral of the amount of incident light. The operations performed after the image-sensing operation is started until the signal φS is fed in are performed simultaneously for all the pixels G11 to Gmn shown in FIG. 1.

While the image-sensing operation is being performed in this way, as in the first embodiment, the MOS transistor T2 receives at its gate, if the brightness is below a predetermined level, a voltage linearly proportional to the amount of incident light or, if the brightness is equal to or above the predetermined level, a voltage natural-logarithmically proportional to the amount of incident light.

Thereafter, a high-level pulse is fed as the signal φV to the gate of the MOS transistor T3 to read out an image signal obtained during the image-sensing operation. Here, the voltage at the node between the capacitor C2 and the gate of the MOS transistor T4 is fed to the MOS transistor T4, which current-amplifies it to produce an output current, which is then delivered through the MOS transistor T3 to the output signal line 6. As a result, the output current thus delivered to the output signal line 6 is linearly or natural-logarithmically proportional to the integral of the amount of incident light.

With each pixel configured as described above, by varying the level VL of the signal φVPS in the resetting operation, it is possible to vary the brightness of the subject at which a switching from linear conversion to logarithmic conversion takes place in the individual pixels. Moreover, in this embodiment, the use of the capacitor C1 makes it possible to integrate the output signal before it is fed out. The capacitor C1 absorbs and eliminates, from the output signal, undesirable components such as fluctuation originating from a light source and high-frequency noise. Thus, it is possible to obtain output signals with a satisfactory S/N ratio. Moreover, by feeding the signal φS simultaneously to all the pixels, it is possible to sample, by using the capacitor C2, the image signals obtained through integration performed simultaneously in the individual pixels. This makes it possible to sense a fast-moving subject with no distortion in the image obtained.

Fourth Embodiment

Figure 8:
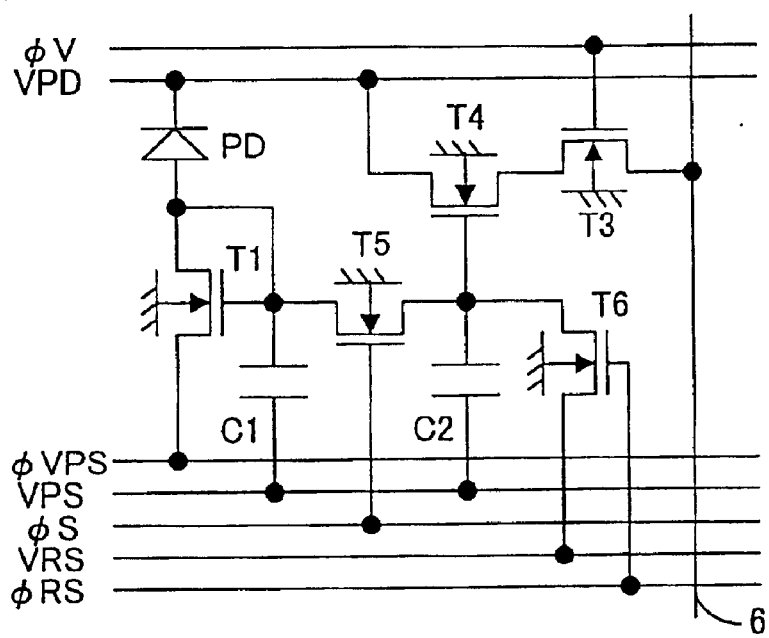
FIG. 8 is a circuit diagram showing an example of the configuration of each pixel in a fourth embodiment of the invention.

Now, a fourth embodiment of the invention will be described with reference to the drawings. FIG. 8 is a circuit diagram showing the configuration of each pixel provided in a solid-state image-sensing device in this embodiment. In the following description, such circuit elements, signal lines, etc. as serve the same purposes as in the pixel shown in FIG. 7 are identified with the same reference numerals or symbols, and their detailed explanations will not be repeated.

As shown in FIG. 8, the pixel of this embodiment is obtained by omitting the MOS transistor T2 from the pixel of the third embodiment (FIG. 7). Specifically, the node between the drain and gate of the MOS transistor T1 is connected to the node between the capacitor C1 and the drain of the MOS transistor T5. This pixel configured as described above operates in the following manner.

When a pulse is fed as the signal φV to the gate of the MOS transistor T3, an output signal is read out. Then, the signal φVPS is turned to the level VL to perform a resetting operation. Here, through the MOS transistor T1, the gate voltage of the MOS transistor T1 is reset, and the capacitor C1 is initialized. Moreover, a pulse is fed in as the signal φRS to initialize the capacitor C2.

Thereafter, when the signal φVPS is turned to the level VH, an image-sensing operation is started, and a voltage linearly or natural-logarithmically proportional to the amount of incident light appears at the gate of the MOS transistor T1. This voltage linearly or natural-logarithmically proportional to the amount of incident light is sampled by the capacitor C1. Next, a high-level pulse is fed as the signal φS to the gate of the MOS transistor T5 to bring this MOS transistor T5 into a conducting state, so that the voltage sampled by the capacitor C1 is sampled by the capacitor C2. As a result, the voltage at the node between the capacitor C2 and the gate of the MOS transistor T4 is now linearly or natural-logarithmically proportional to the amount of incident light. The operations performed after the image-sensing operation is started until the signal φS is fed in are performed simultaneously for all the pixels G11 to Gmn shown in FIG. 1.

While the image-sensing operation is being performed in this way, as in the third embodiment, an output linearly proportional to the amount of incident light or an output natural-logarithmically proportional to the amount of incident light is sampled in the capacitor C1.

With each pixel configured as described above, by varying the level VL of the signal φVPS in the resetting operation, it is possible to vary the brightness of the subject at which a switching from linear conversion to logarithmic conversion takes place in the individual pixels. Moreover, in this embodiment, the use of the capacitor C1 makes it possible to integrate the output signal before it is fed out. The capacitor C1 absorbs and eliminates, from the output signal, undesirable components such as fluctuation originating from a light source and high-frequency noise. Thus, it is possible to obtain output signals with a satisfactory S/N ratio. Moreover, by feeding the signal φS simultaneously to all the pixels, it is possible to sample, by using the capacitor C2, the image signals obtained through sampling performed simultaneously in the individual pixels by using capacitor C1. This makes it possible to sense a fast-moving subject with no distortion in the image obtained.

Fifth Embodiment

Figure 9:
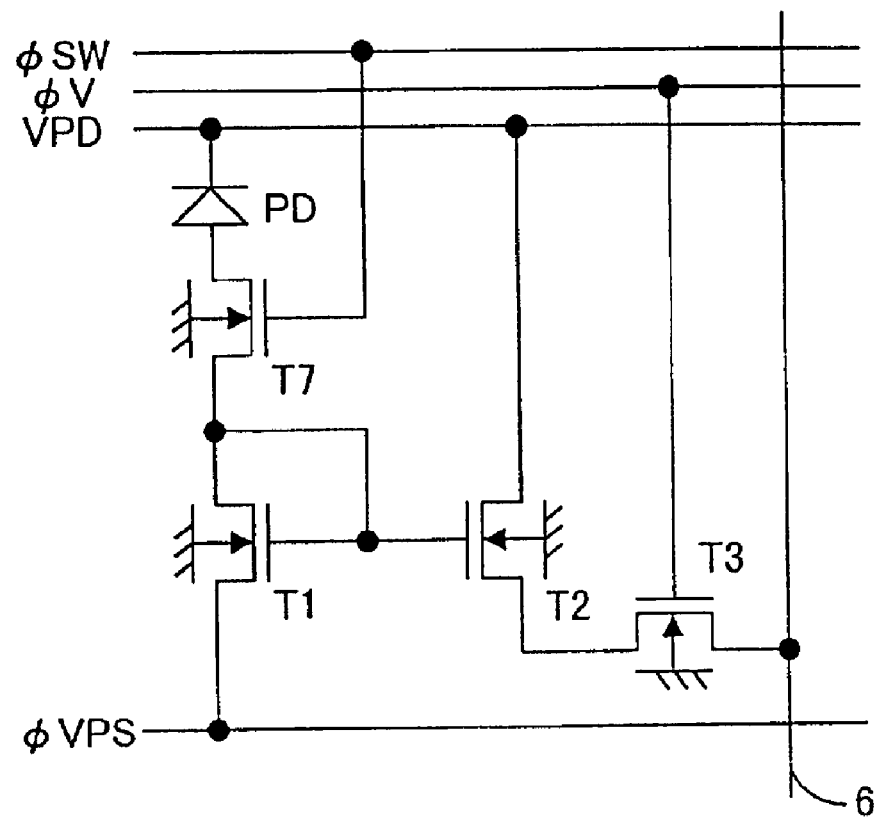
FIG. 9 is a circuit diagram showing an example of the configuration of each pixel in a fifth embodiment of the invention.

Now, a fifth embodiment of the invention will be described with reference to the drawings. FIG. 9 is a circuit diagram showing the configuration of each pixel provided in a solid-state image-sensing device in this embodiment. In the following description, such circuit elements, signal lines, etc. as serve the same purposes as in the pixel shown in FIG. 3 are identified with the same reference numerals or symbols, and their detailed explanations will not be repeated.

As shown in FIG. 9, the pixel of this embodiment is obtained by additionally providing, in the pixel of the first embodiment (FIG. 3), a MOS transistor T7 that is connected between the anode of the photodiode PD and the drain of the MOS transistor T1. The MOS transistor T7 has its drain connected to the anode of the photodiode PD, has its source connected to the drain of the MOS transistor T1, and receives a signal φSW at its gate. The MOS transistor T7, like the MOS transistors T1 to T3, is an N-channel MOS transistor with its back gate grounded.

In this pixel configured as described above, in either of a resetting or image-sensing operation, by keeping a high level fed as the signal φSW to the gate of the MOS transistor T7 so as to keep the MOS transistor T7 on, it is possible to keep the pixel in the same state as the pixel of the first embodiment. That is, by keeping the MOS transistor T7 on so as to keep the anode of the photodiode PD electrically connected to the drain of the MOS transistor T1, it is possible to switch between linear conversion and logarithmic conversion automatically according to the brightness of the subject. Thus, how this pixel operates when the MOS transistor T7 is kept on is the same as described earlier in connection with the first embodiment, and therefore will not be described anew.

On the other hand, by turning the MOS transistor T7 on and off with predetermined timing in a resetting operation, it is possible to make the pixel configured as shown in FIG. 9 perform logarithmic conversion over the entire brightness range in an image-sensing operation. Now, how the pixel configured as shown in FIG. 9 operates when it performs logarithmic conversion over the entire brightness range in an image-sensing operation in this way will be described. In this case, the signal φVPS takes either a level Vh that is substantially equal to the direct-current voltage VPS and makes the MOS transistor T1 operate in a subthreshold region or a level Vl that is lower than the level Vh and brings the MOS transistor T1 into a conducting state.

Figure 10:
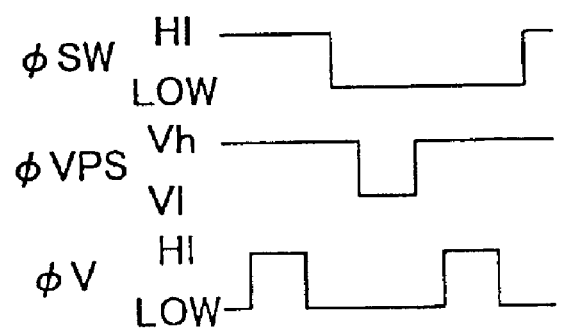
FIG. 10 is a timing chart showing the operation of each pixel in the fifth embodiment.

As shown in a timing chart in FIG. 10, when a pulse is fed as the signal φV to the gate of the MOS transistor T3, an output signal is read out. Then, the signal φSW is turned to a low level to perform a resetting operation. Here, negative electric charge flows into the MOS transistor T1 through its source, and is recombined with the positive electric charge accumulated at the gate and drain of the MOS transistor T1, at the gate of the MOS transistor T2, and at the anode of the photodiode PD. As a result, the resetting operation progresses to a certain degree, permitting the potential at the drain and sub-gate region of the MOS transistor T1 to lower.

However, as the potential at the drain and sub-gate region of the MOS transistor T1 is being reset to its original level, when the potential becomes equal to a certain level, the resetting operation slows down. This slowing down is particularly remarkable when a bright subject suddenly becomes dim. To avoid this, next, the signal φVPS fed to the source of the MOS transistor T1 is turned to the level Vl. Lowering the source voltage of the MOS transistor T1 in this way increases the amount of negative electric charge that flows into the MOS transistor T1 through its source. This prompts the recombination of the positive electric charge accumulated at the gate and drain of the MOS transistor T1, at the gate of the MOS transistor T2, and at the anode of the photodiode PD.

Thus, the potential at the drain and sub-gate region of the MOS transistor T1 lowers further. Then, the signal φVPS fed to the source of the MOS transistor T1 is turned to the level Vh, so that the MOS transistor T1 is reset to its original potential state. After the MOS transistor T1 is reset to its original potential state in this way, a high-level pulse is fed as the signal φV to the gate of the MOS transistor T3 to read out a noise signal obtained during the resetting operation. After the noise signal is read out in this way, the MOS transistor T3 is turned off, and then the signal φSW is turned to a high level in preparation for an image-sensing operation that is to follow.

When the signal φSW is turned to a high level, the image-sensing operation is started, and an amount of photoelectric charge commensurate with the amount of incident light flows from the photodiode PD into the MOS transistor T1. Now, the MOS transistor T1 receives as its source voltage the level Vh as the signal φVPS, and therefore operates in a subthreshold region. As a result, a voltage natural-logarithmically proportional to the photocurrent appears at the gates of the MOS transistors T1 and T2.

When a voltage natural-logarithmically proportional to the amount of incident light appears at the gates of the MOS transistors T1 and T2 in this way, in the same manner as described above, a pulse is fed as the signal φV to the gate of the MOS transistor T3. As a result, the gate voltage of the MOS transistor T1, which is natural-logarithmically proportional to the amount of incident light, is current-amplified by the MOS transistor T2, and is then delivered through the MOS transistor T3 to the output signal line 6. After an image signal is read out in this way, the resetting operation described earlier is performed.

In this way, by turning the MOS transistor T7 off in the resetting operation, it is possible to reset the MOS transistor T1 without the influence of the photocurrent flowing from the photodiode PD. On the other hand, in the image-sensing operation, the MOS transistor T1 operates in a subthreshold region all the time, and therefore it is possible to make the pixel perform logarithmic conversion over the entire brightness range.

The noise signals from the individual pixels are fed out by way of the signal line 9 shown in FIG. 1, serially from one pixel after another, so as to be stored as pixel-by-pixel noise signals in a memory provided in the succeeding circuit. Then, the image signals from the individual pixels are corrected with the noise signals thus stored. In this way, it is possible to eliminate, from the image signals, components resulting from variations in characteristics among the individual pixels. A practical example of how this correction is achieved is shown in FIG. 50 and will be described later. Alternatively, similar correction may be realized by providing memories, such as line memories, within the pixels.

Sixth Embodiment

Figure 11:
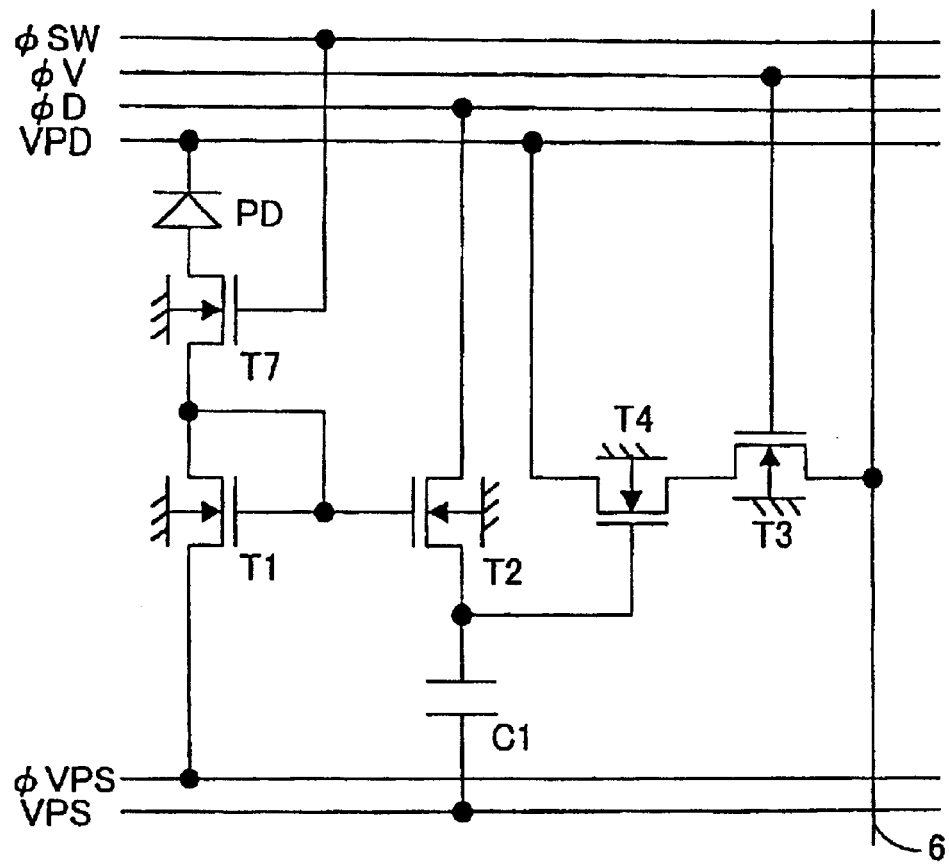
FIG. 11 is a circuit diagram showing an example of the configuration of each pixel in a sixth embodiment of the invention.

Now, a sixth embodiment of the invention will be described with reference to the drawings. FIG. 11 is a circuit diagram showing the configuration of each pixel provided in a solid-state image-sensing device in this embodiment. In the following description, such circuit elements, signal lines, etc. as serve the same purposes as in the pixel shown in FIG. 5 are identified with the same reference numerals or symbols, and their detailed explanations will not be repeated.

As shown in FIG. 11, the pixel of this embodiment, like that of the fifth embodiment (FIG. 9), is obtained by additionally providing, in the pixel of the second embodiment (FIG. 5), a MOS transistor T7 that is connected between the anode of the photodiode PD and the drain of the MOS transistor T1. The MOS transistor T7 has its drain connected to the anode of the photodiode PD, has its source connected to the drain of the MOS transistor T1, and receives a signal φSW at its gate.

In this pixel configured as described above, as in the fifth embodiment, in either of a resetting or image-sensing operation, by keeping a high level fed as the signal φSW to the gate of the MOS transistor T7 so as to keep the MOS transistor T7 on, it is possible to keep the pixel in the same state as the pixel of the second embodiment. That is, by keeping the MOS transistor T7 on so as to keep the anode of the photodiode PD electrically connected to the drain of the MOS transistor T1, it is possible to switch between linear conversion and logarithmic conversion automatically according to the brightness of the subject. Thus, how this pixel operates when the MOS transistor T7 is kept on is the same as described earlier in connection with the second embodiment, and therefore will not be described anew.

On the other hand, as in the fifth embodiment, by turning the MOS transistor T7 on and off with predetermined timing in a resetting operation, it is possible to make the pixel configured as shown in FIG. 11 perform logarithmic conversion over the entire brightness range in an image-sensing operation. Now, how the pixel configured as shown in FIG. 11 operates when it performs logarithmic conversion over the entire brightness range in an image-sensing operation in this way will be described. In this case, the signal φVPS takes either a level Vh that is substantially equal to the direct-current voltage VPS and makes the MOS transistor T1 operate in a subthreshold region or a level Vl that is lower than the level Vh and brings the MOS transistor T1 into a conducting state.

Figure 12:
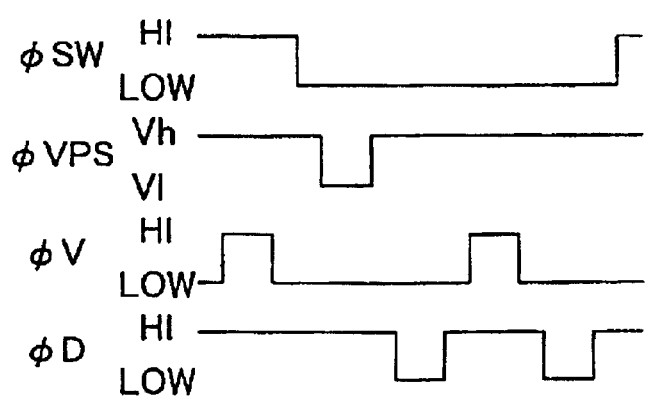
FIG. 12 is a timing chart showing the operation of each pixel in the sixth embodiment.

As shown in a timing chart in FIG. 12, when a pulse is fed as the signal φV to the gate of the MOS transistor T3, an output signal is read out. Then, the signal φSW is turned to a low level to perform a resetting operation. Here, negative electric charge flows into the MOS transistor T1 through its source, and is recombined with the positive electric charge accumulated at the gate and drain of the MOS transistor T1, at the gate of the MOS transistor T2, and at the anode of the photodiode PD. As a result, the resetting operation progresses to a certain degree.

Next, the signal φVPS fed to the source of the MOS transistor T1 is turned to the level Vl. Lowering the source voltage of the MOS transistor T1 in this way increases the amount of negative electric charge that flows into the MOS transistor T1 through its source. This prompts the recombination of the positive electric charge accumulated at the gate and drain of the MOS transistor T1, at the gate of the MOS transistor T2, and at the anode of the photodiode PD.

Thus, the potential at the drain and sub-gate region of the MOS transistor Ti lowers further. Then, the signal φVPS fed to the source of the MOS transistor T1 is turned to the level Vh, so that the MOS transistor T1 is reset to its original potential state. After the MOS transistor T1 is reset to its original potential state in this way, first, a low-level pulse is fed as the signal φD to the drain of the MOS transistor T2, so that the electric charge accumulated in the capacitor C1 is discharged through the MOS transistor T2 to the signal line of the signal φD. This initializes the voltage at the node between the capacitor C1 and the source of the MOS transistor T2.

Then, the gate voltage of the MOS transistor T1 in its reset state is fed to the gate of the MOS transistor T2, so that the drain current of the MOS transistor T2, which the MOS transistor T2 produces by current-amplifying the gate voltage of the MOS transistor T1, flows to the capacitor C1, and thus charges the capacitor C1. As a result, the voltage at the node between the capacitor C1 and the source of the MOS transistor T2 is now commensurate with the gate voltage of the MOS transistor T1 in its reset state.

Next, a high-level pulse is fed as the signal φV to the gate of the MOS transistor T3 to read out a noise signal obtained during the resetting operation. Here, the voltage at the node between the capacitor C1 and the source of the MOS transistor T2 is fed to the MOS transistor T4, which current-amplifies it to produce an output current, which is then delivered through the MOS transistor T3 to the output signal line 6. After the noise signal is read out in this way, a low-level signal is fed as the signal φD to the drain of the MOS transistor T2 again to reset the voltage at the node between the capacitor C1 and the source of the MOS transistor T2. Then, the signal φSW is turned to a high level in preparation for an image-sensing operation that is to follow.

When the signal φSW is turned to a high level, image-sensing operation is started, and an amount of photoelectric charge commensurate with the amount of incident light flows from the photodiode PD into the MOS transistor T1. Now, the MOS transistor T1 receives as its source voltage the level Vh as the signal φVPS, and therefore operates in a subthreshold region. As a result, a voltage natural-logarithmically proportional to the photocurrent appears at the gates of the MOS transistors T1 and T2.

When a voltage natural-logarithmically proportional to the amount of incident light appears at the gates of the MOS transistors T1 and T2 in this way, this voltage natural-logarithmically proportional to the amount of incident light is current-amplified by the MOS transistor T2, and the resulting current, i.e. the drain current of the MOS transistor T2, flows to the capacitor C1, and thus charges the capacitor C1. As a result, the voltage at the node between the capacitor C1 and the source of the MOS transistor T2 is now natural-logarithmically proportional to the integral of the amount of incident light.

Then, in the same manner as described above, a high-level pulse is fed as the signal φV to the gate of the MOS transistor T3 to read out an image signal obtained during the image-sensing operation. Here, the voltage at the node between the capacitor C1 and the source of the MOS transistor T2 is fed to the MOS transistor T4, which current-amplifies it to produce an output current, which is then delivered through the MOS transistor T3 to the output signal line 6. As a result, the output current thus delivered to the output signal line 6 is natural-logarithmically proportional to the integral of the amount of incident light. After the image signal is read out in this way, the resetting operation described earlier is performed.

In this way, by turning the MOS transistor T7 off in the resetting operation, it is possible to reset the MOS transistor T1 without the influence of the photocurrent flowing from the photodiode PD. On the other hand, in the image-sensing operation, the MOS transistor T1 operates in a subthreshold region all the time, and therefore it is possible to make the pixel perform logarithmic conversion over the entire brightness range.

The noise signals from the individual pixels are fed out by way of the signal line 9 shown in FIG. 1, serially from one pixel after another, so as to be stored as pixel-by-pixel noise signals in a memory provided in the succeeding circuit. Then, the image signals from the individual pixels are corrected with the noise signals thus stored. In this way, it is possible to eliminate, from the image signals, components resulting from variations in characteristics among the individual pixels. A practical example of how this correction is achieved is shown in FIG. 50 and will be described later. Alternatively, similar correction may be realized by providing memories, such as line memories, within the pixels.

Seventh Embodiment

Figure 13:
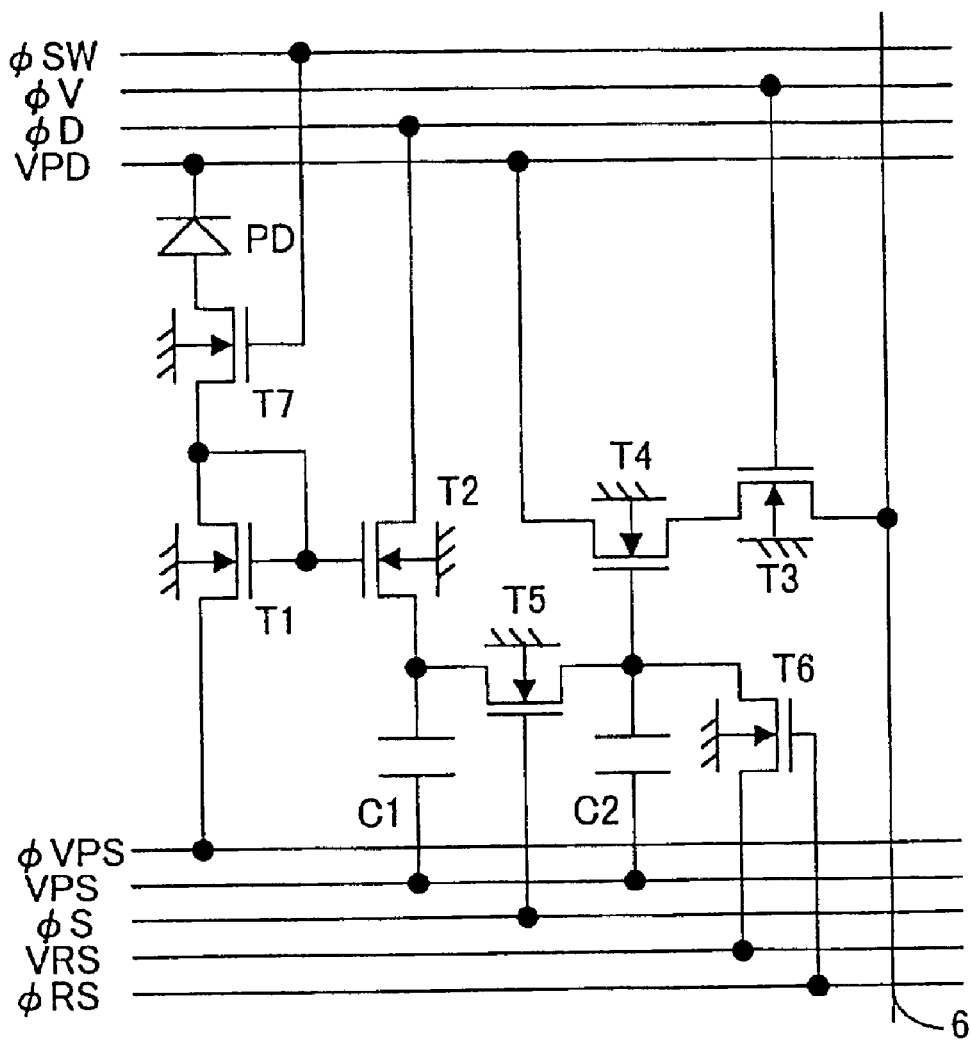
FIG. 13 is a circuit diagram showing an example of the configuration of each pixel in a seventh embodiment of the invention.

Now, a seventh embodiment of the invention will be described with reference to the drawings. FIG. 13 is a circuit diagram showing the configuration of each pixel provided in a solid-state image-sensing device in this embodiment. In the following description, such circuit elements, signal lines, etc. as serve the same purposes as in the pixel shown in FIG. 7 are identified with the same reference numerals or symbols, and their detailed explanations will not be repeated.

As shown in FIG. 13, the pixel of this embodiment, like that of the fifth embodiment (FIG. 9), is obtained by additionally providing, in the pixel of the third embodiment (FIG. 7), a MOS transistor T7 that is connected between the anode of the photodiode PD and the drain of the MOS transistor T1. The MOS transistor T7 has its drain connected to the anode of the photodiode PD, has its source connected to the drain of the MOS transistor T1, and receives a signal φSW at its gate.

In this pixel configured as described above, as in the fifth embodiment, in either of a resetting or image-sensing operation, by keeping a high level fed as the signal φSW to the gate of the MOS transistor T7 so as to keep the MOS transistor T7 on, it is possible to keep the pixel in the same state as the pixel of the third embodiment. That is, by keeping the MOS transistor T7 on so as to keep the anode of the photodiode PD electrically connected to the drain of the MOS transistor T1, it is possible to switch between linear conversion and logarithmic conversion automatically according to the brightness of the subject. Thus, how this pixel operates when the MOS transistor T7 is kept on is the same as described earlier in connection with the third embodiment, and therefore will not be described anew.

On the other hand, as in the fifth embodiment, by turning the MOS transistor T7 on and off with predetermined timing in a resetting operation, it is possible to make the pixel configured as shown in FIG. 13 perform logarithmic conversion over the entire brightness range in an image-sensing operation. Now, how the pixel configured as shown in FIG. 13 operates when it performs logarithmic conversion over the entire brightness range in an image-sensing operation in this way will be described. In this case, the signal φVPS takes either a level Vh that is substantially equal to the direct-current voltage VPS and makes the MOS transistor T1 operate in a subthreshold region or a level Vl that is lower than the level Vh and brings the MOS transistor T1 into a conducting state.

When a pulse is fed as the signal φV to the gate of the MOS transistor T3, an output signal is read out. Then, the signal φSW is turned to a low level to perform a resetting operation. Here, the signal φVPS fed to the source of the MOS transistor T1 is turned to the level Vl to bring the MOS transistor T1 into a conducting state. This increases the amount of negative electric charge that flows into the MOS transistor T1 through its source, and thereby prompts the recombination of the positive electric charge accumulated at the gate and drain of the MOS transistor T1, at the gate of the MOS transistor T2, and at the anode of the photodiode PD.

Then, the signal φVPS fed to the source of the MOS transistor T1 is turned to the level Vh, so that the MOS transistor T1 is reset to its original potential state. After the MOS transistor T1 is reset to its original potential state in this way, a low-level pulse is fed as the signal φD to the drain of the MOS transistor T2, so that the electric charge accumulated in the capacitor C1 is discharged through the MOS transistor T2 to the signal line of the signal φD. This initializes the voltage at the node between the capacitor C1 and the source of the MOS transistor T2. Moreover, a pulse is fed in as the signal φRS to initialize the capacitor C2.

Then, the gate voltage of the MOS transistor T1 in its reset state is fed to the gate of the MOS transistor T2, so that the drain current of the MOS transistor T2, which the MOS transistor T2 produces by current-amplifying the gate voltage of the MOS transistor T1, flows to the capacitor C1, and thus charges the capacitor C1. As a result, the voltage at the node between the capacitor C1 and the source of the MOS transistor T2 is now commensurate with the gate voltage of the MOS transistor T1 in its reset state.

Then, the signal φSW is turned to a high level to start an image-sensing operation. The MOS transistor T1 receives as its source voltage the level Vh as the signal φVPS, and therefore operates in a subthreshold region. As a result, a voltage natural-logarithmically proportional to the amount of light incident on the photodiode PD appears at the gates of the MOS transistors T1 and T2. This voltage natural-logarithmically proportional to the amount of incident light is current-amplified by the MOS transistor T2, and the resulting current, i.e. the drain current of the MOS transistor T2, flows to the capacitor C1, and thus charges the capacitor C1. As a result, the voltage at the node between the capacitor C1 and the source of the MOS transistor T2 is now natural-logarithmically proportional to the integral of the amount of incident light.

Next, a high-level pulse is fed as the signal φS to the gate of the MOS transistor T5 to bring this MOS transistor T5 into a conducting state, so that the voltage at the node between the capacitor C1 and the source of the MOS transistor T2 is sampled by the capacitor C2. As a result, the voltage at the node between the capacitor C2 and the gate of the MOS transistor T4 is now natural-logarithmically proportional to the integral of the amount of incident light. The operations performed after the image-sensing operation is started until the signal φS is fed in are performed simultaneously for all the pixels G11 to Gmn shown in FIG. 1.

Thereafter, a high-level pulse is fed as the signal φV to the gate of the MOS transistor T3 to read out an image signal obtained during the image-sensing operation. Here, the voltage at the node between the capacitor C2 and the gate of the MOS transistor T4 is fed to the MOS transistor T4, which current-amplifies it to produce an output current, which is then delivered through the MOS transistor T3 to the output signal line 6. As a result, the output current thus delivered to the output signal line 6 is natural-logarithmically proportional to the integral of the amount of incident light.

In this way, by turning the MOS transistor T7 off in the resetting operation, it is possible to reset the MOS transistor T1 without the influence of the photocurrent flowing from the photodiode PD. On the other hand, in the image-sensing operation, the MOS transistor T1 operates in a subthreshold region all the time, and therefore it is possible to make the pixel perform logarithmic conversion over the entire brightness range.

Eighth Embodiment

Figure 14:
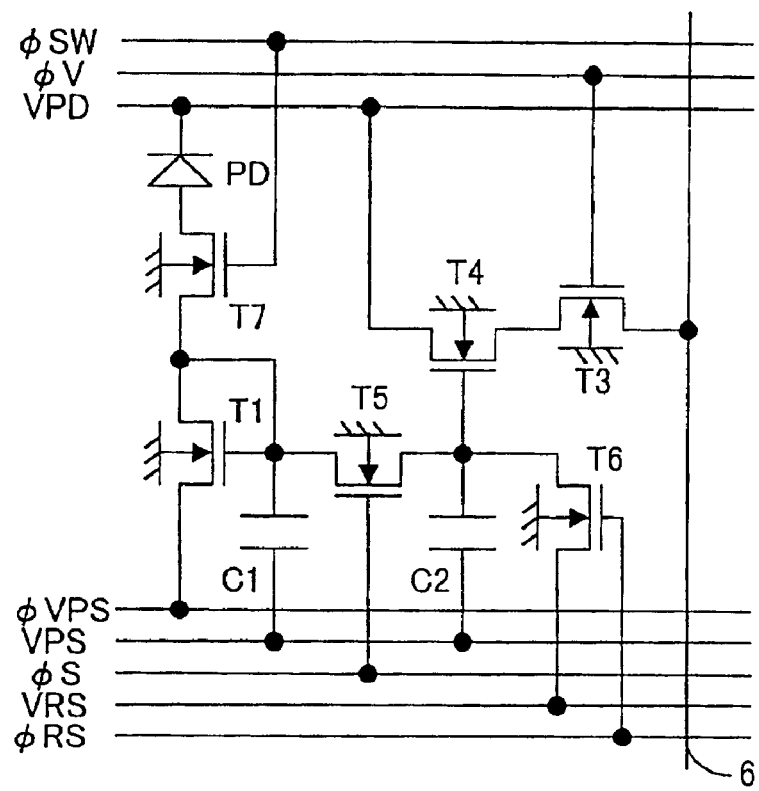
FIG. 14 is a circuit diagram showing an example of the configuration of each pixel in an eighth embodiment of the invention.
Figure 15:
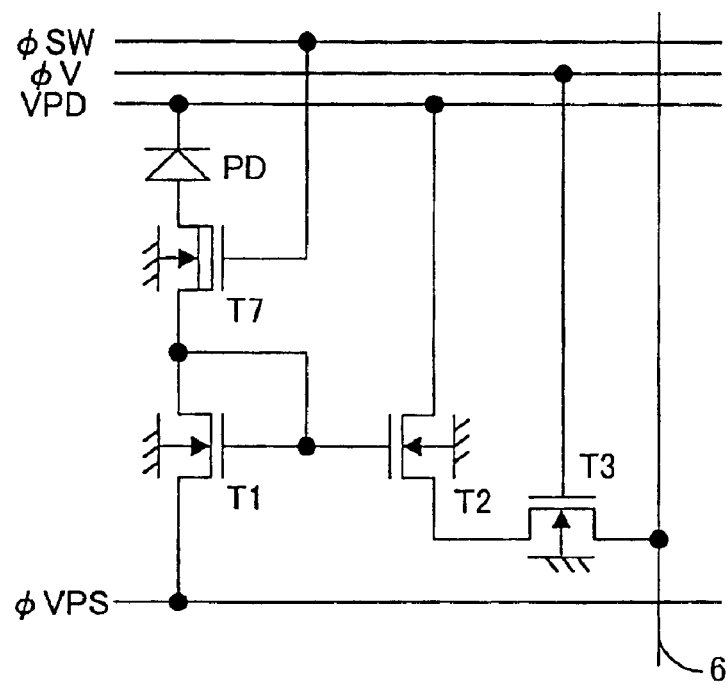
FIG. 15 is a circuit diagram showing another example of the configuration of each pixel in a fifth embodiment of the invention.
Figure 16:
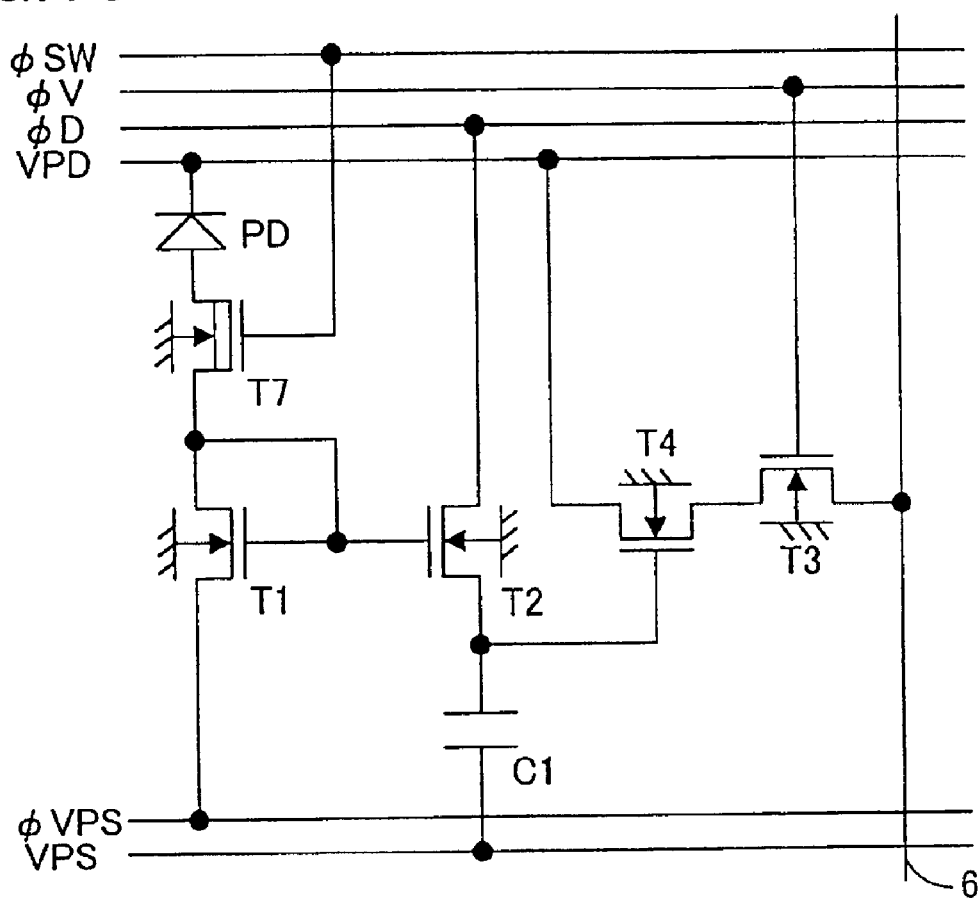
FIG. 16 is a circuit diagram showing another example of the configuration of each pixel in a sixth embodiment of the invention.
Figure 17:
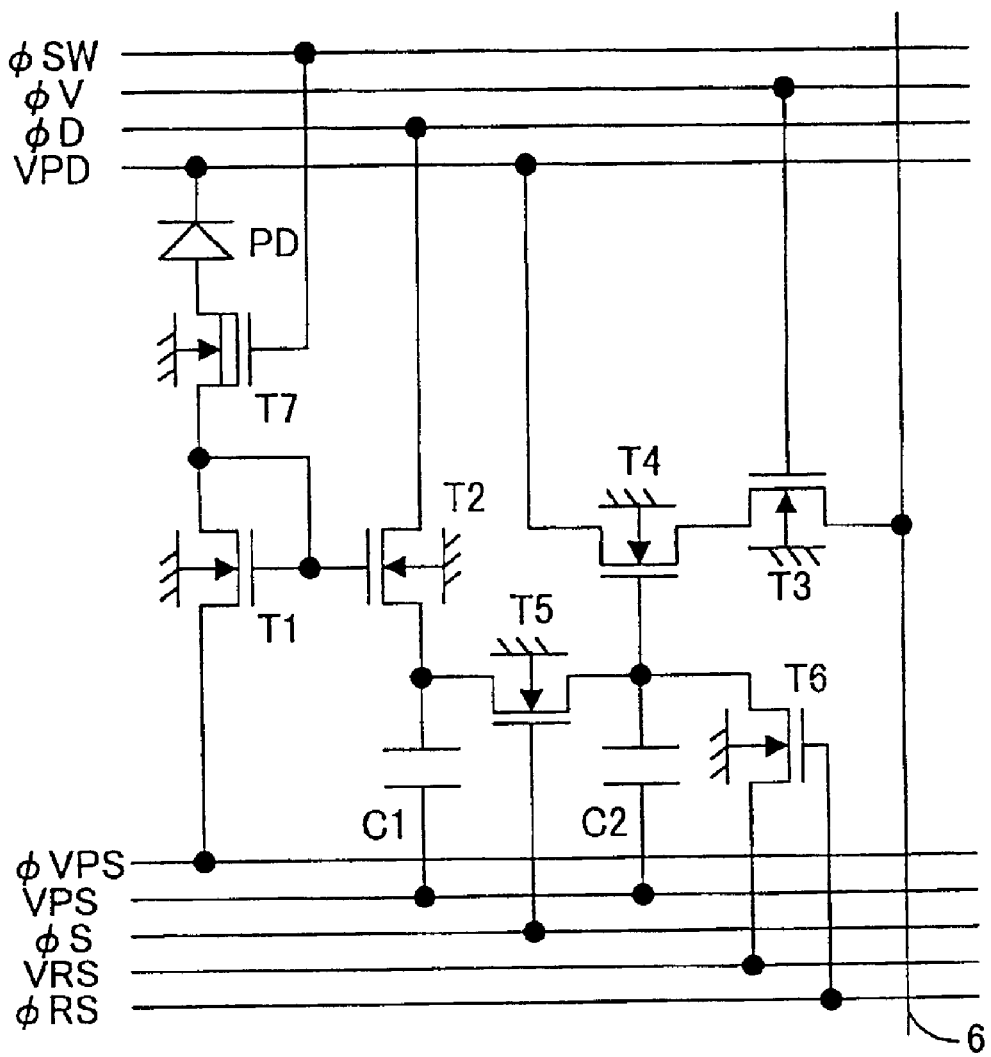
FIG. 17 is a circuit diagram showing another example of the configuration of each pixel in a seventh embodiment of the invention.
Figure 18:
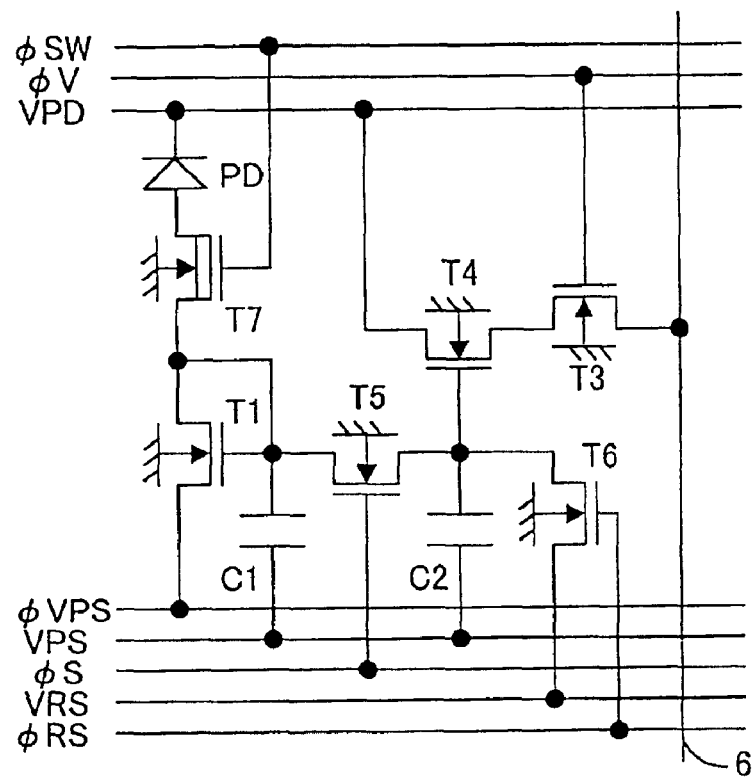
FIG. 18 is a circuit diagram showing another example of the configuration of each pixel in an eighth embodiment of the invention.
Figure 19:
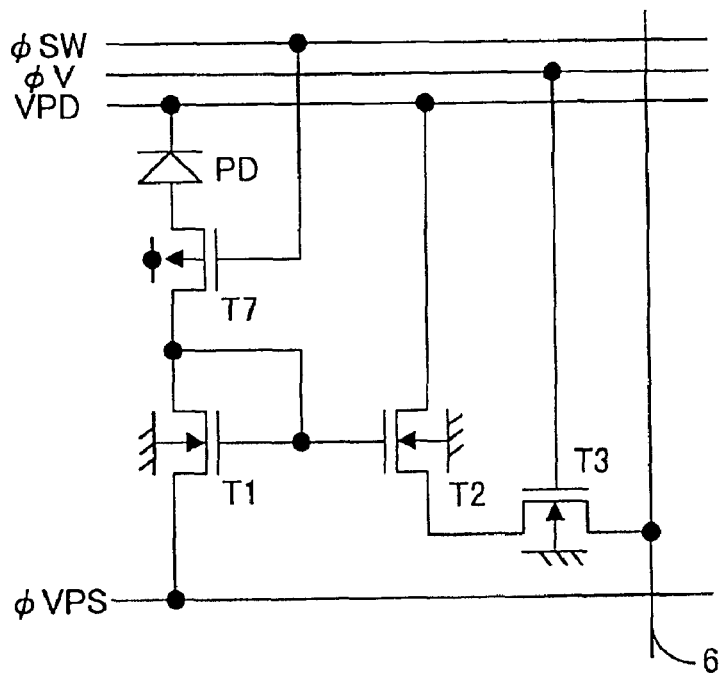
FIG. 19 is a circuit diagram showing another example of the configuration of each pixel in a fifth embodiment of the invention.
Figure 20:
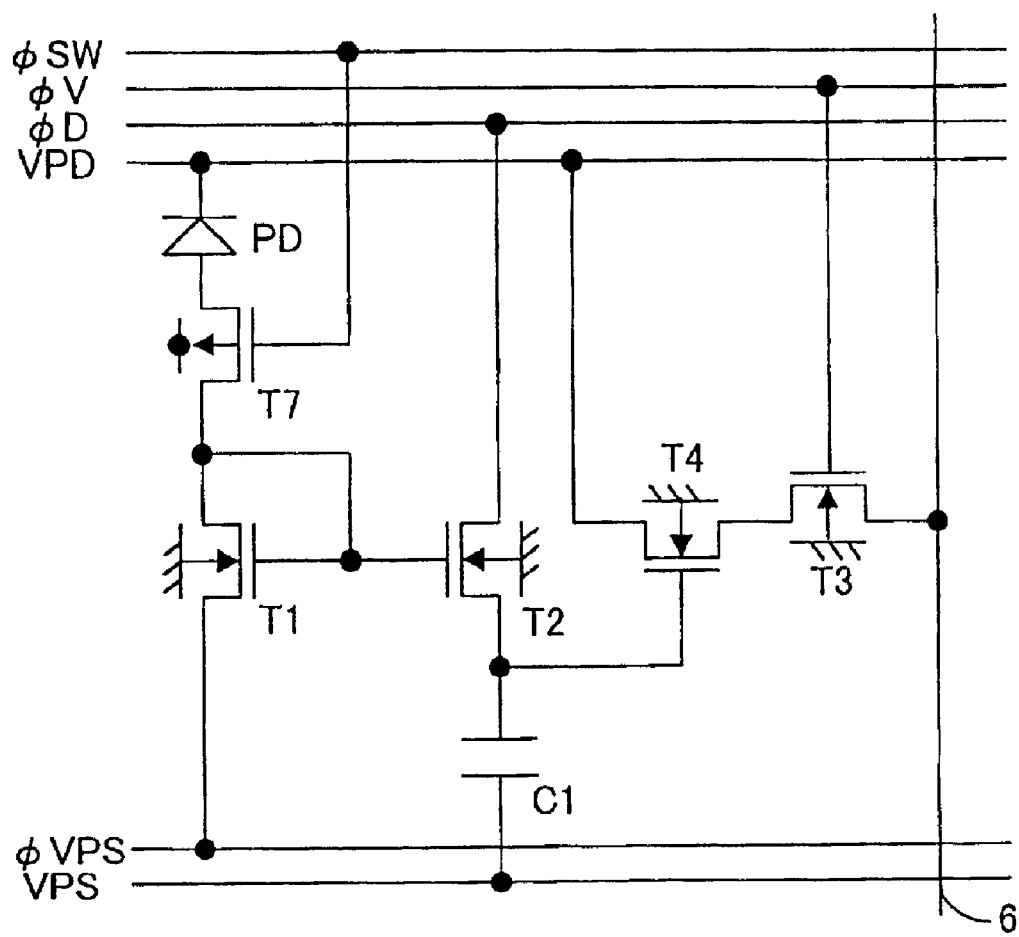
FIG. 20 is a circuit diagram showing another example of the configuration of each pixel in a sixth embodiment of the invention.
Figure 21:
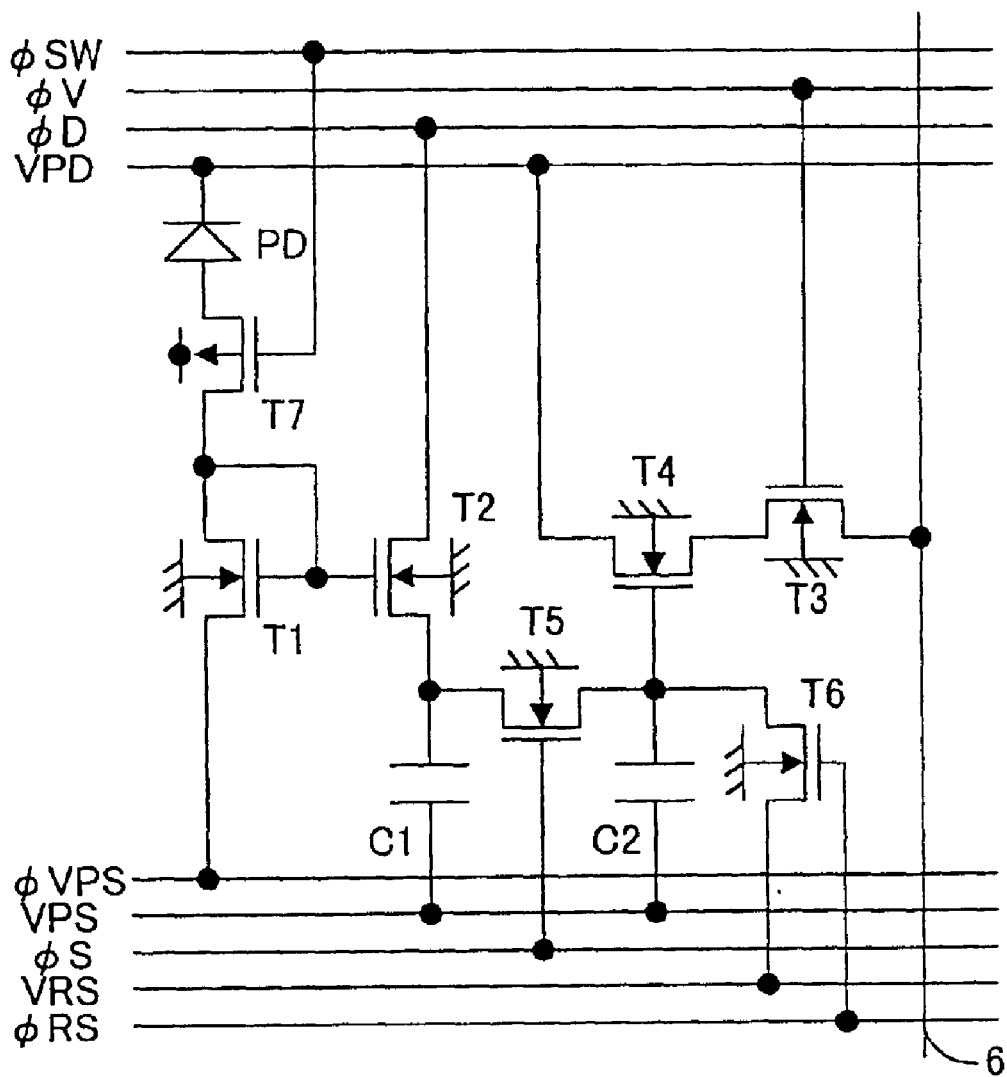
FIG. 21 is a circuit diagram showing another example of the configuration of each pixel in a seventh embodiment of the invention.
Figure 22:
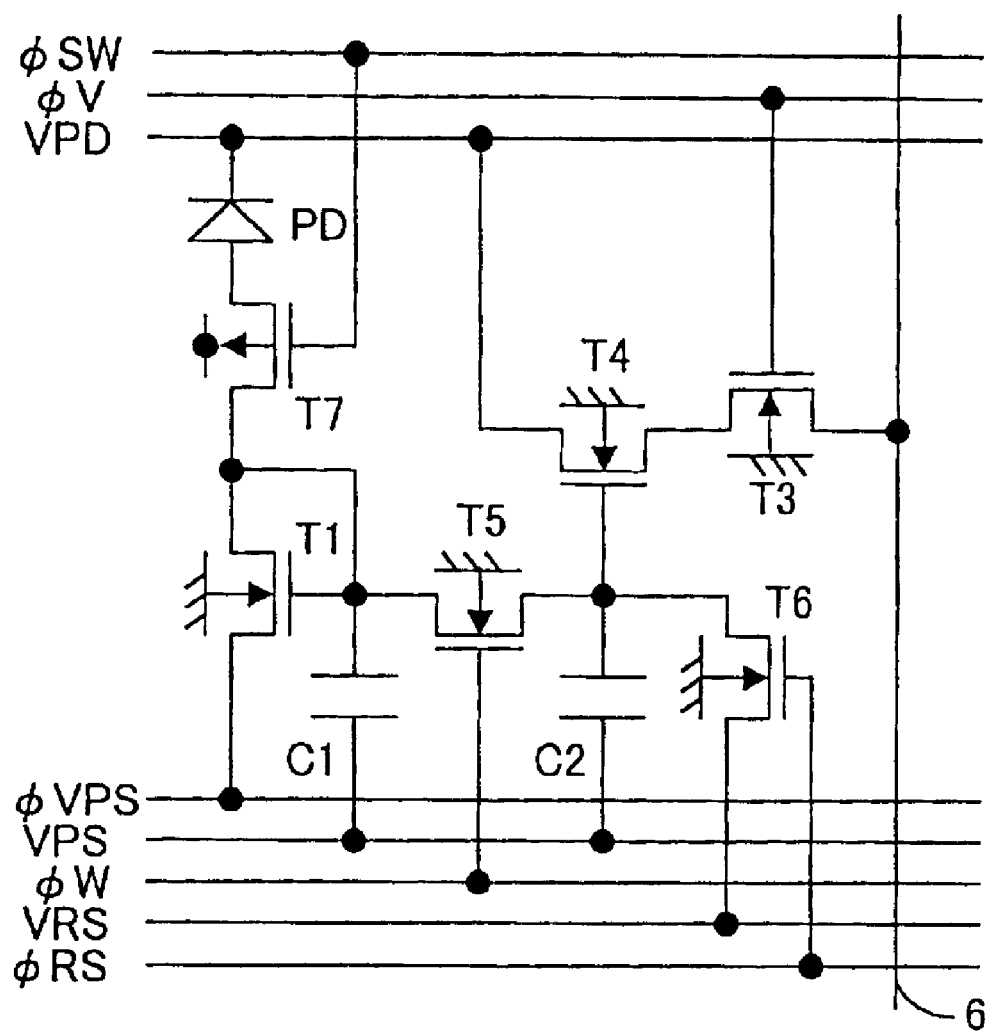
FIG. 22 is a circuit diagram showing another example of the configuration of each pixel in an eighth embodiment of the invention.

Now, an eighth embodiment of the invention will be described with reference to the drawings. FIG. 14 is a circuit diagram showing the configuration of each pixel provided in a solid-state image-sensing device in this embodiment. In the following description, such circuit elements, signal lines, etc. as serve the same purposes as in the pixel shown in FIG. 8 are identified with the same reference numerals or symbols, and their detailed explanations will not be repeated.

As shown in FIG. 14, the pixel of this embodiment, like that of the fifth embodiment (FIG. 9), is obtained by additionally providing, in the pixel of the fourth embodiment (FIG. 8), a MOS transistor T7 that is connected between the anode of the photodiode PD and the drain of the MOS transistor T1. The MOS transistor T7 has its drain connected to the anode of the photodiode PD, has its source connected to the drain of the MOS transistor T1, and receives a signal φSW at its gate.

In this pixel configured as described above, as in the fifth embodiment, in either of a resetting or image-sensing operation, by keeping a high level fed as the signal φSW to the gate of the MOS transistor T7 so as to keep the MOS transistor T7 on, it is possible to keep the pixel in the same state as the pixel of the fourth embodiment. That is, by keeping the MOS transistor T7 on so as to keep the anode of the photodiode PD electrically connected to the drain of the MOS transistor T1, it is possible to switch between linear conversion and logarithmic conversion automatically according to the brightness of the subject. Thus, how this pixel operates when the MOS transistor T7 is kept on is the same as described earlier in connection with the fourth embodiment, and therefore will not be described anew.

On the other hand, as in the fifth embodiment, by turning the MOS transistor T7 on and off with predetermined timing in a resetting operation, it is possible to make the pixel configured as shown in FIG. 14 perform logarithmic conversion over the entire brightness range in an image-sensing operation. Now, how the pixel configured as shown in FIG. 14 operates when it performs logarithmic conversion over the entire brightness range in an image-sensing operation in this way will be described. In this case, the signal φVPS takes either a level Vh that is substantially equal to the direct-current voltage VPS and makes the MOS transistor T1 operate in a subthreshold region or a level Vl that is lower than the level Vh and brings the MOS transistor T1 into a conducting state.

When a pulse is fed as the signal φV to the gate of the MOS transistor T3, an output signal is read out. Then, the signal φSW is turned to a low level to perform a resetting operation. Here, the signal φVPS fed to the source of the MOS transistor T1 is turned to the level Vl to bring the MOS transistor T1 into a conducting state. This increases the amount of negative electric charge that flows into the MOS transistor T1 through its source, and thereby prompts the recombination of the positive electric charge accumulated at the gate and drain of the MOS transistor T1, at the gate of the MOS transistor T2, and at the anode of the photodiode PD.

Then, the signal φVPS fed to the source of the MOS transistor T1 is turned to the level Vh, so that the MOS transistor T1 is reset to its original potential state. Next, the signal φSW is turned to a high level to start an image-sensing operation. The MOS transistor T1 receives as its source voltage the level Vh as the signal φVPS, and therefore operates in a subthreshold region. As a result, a voltage natural-logarithmically proportional to the amount of light incident on the photodiode PD appears at the gate of the MOS transistor T1. This voltage natural-logarithmically proportional to the amount of incident light is sampled by the capacitor C1.

After the gate voltage of the MOS transistor T1 as obtained during the image-sensing operation is sampled in the capacitor C1 in this way, a high-level pulse is fed as the signal φS to the gate of the MOS transistor T5 to bring this MOS transistor T5 into a conducting state, so that the voltage sampled by the capacitor C1 is sampled by the capacitor C2. As a result, the voltage at the node between the capacitor C2 and the gate of the MOS transistor T4 is now natural-logarithmically proportional to the amount of incident light. The operations performed after the image-sensing operation is started until the signal φS is fed in are performed simultaneously for all the pixels G11 to Gmn shown in FIG. 1.

Thereafter, a high-level pulse is fed as the signal φV to the gate of the MOS transistor T3 to read out an image signal obtained during the image-sensing operation. Here, the voltage at the node between the capacitor C2 and the gate of the MOS transistor T4 is fed to the MOS transistor T4, which current-amplifies it to produce an output current, which is then delivered through the MOS transistor T3 to the output signal line 6. As a result, the output current thus delivered to the output signal line 6 is natural-logarithmically proportional to the integral of the amount of incident light.

In this way, by turning the MOS transistor T7 off in the resetting operation, it is possible to reset the MOS transistor T1 without the influence of the photocurrent flowing from the photodiode PD. On the other hand, in the image-sensing operation, the MOS transistor T1 operates in a subthreshold region all the time, and therefore it is possible to make the pixel perform logarithmic conversion over the entire brightness range.

Pixel Configurations Including a Depletion-Mode MOS Transistor

In the fifth to eighth embodiments (FIGS. 9, 11, 13, and 14), the MOS transistor T7 may be formed as a depletion-mode N-channel MOS transistor. In that case, the pixels of those embodiments have circuit configurations as shown in FIGS. 15 to 18, respectively. As shown in FIGS. 15 to 18, all the other transistors T1 to T6 than the MOS transistor T7 are formed as enhancement-mode N-channel MOS transistors.

Where all the MOS transistors provided within each pixel are enhancement-mode MOS transistors as in the pixels shown in FIGS. 9, 11, 13, and 14, the MOS transistors T1 and T7 are connected in series, and therefore the high-level voltage of the signal φSW fed to the gate of the MOS transistor T7 is usually higher than the voltage supplied to the pixel. Thus, it is usually necessary to provide a separate power source for feeding the signal φSW to the MOS transistor T7.

By contrast, by using as this MOS transistor T7 a depletion-mode MOS transistor, it is possible to lower the high-level voltage of the signal φSW fed to the gate thereof, and thus make this high-level voltage equal to the high-level signals fed to the other MOS transistors. This is because a depletion-mode MOS transistor has a negative threshold voltage value and can thus be turned on with a lower gate voltage than an enhancement-mode MOS transistor.

Pixel Configurations Including a P-Channel MOS Transistor

Alternatively, in the fifth to eighth embodiments, the MOS transistor T7 may be formed as a P-channel MOS transistor. In that case, the pixels of those embodiments have circuit configurations as shown in FIGS. 19 to 22, respectively. As shown in FIGS. 19 to 22, all the other transistors T1 to T6 than the MOS transistor T7 are formed as N-channel MOS transistors. Here, the MOS transistor T7 has its source connected to the anode of the photodiode PD, and has its drain connected to the drain of the MOS transistor T1.

In these circuit configurations, the MOS transistor T7 is turned on when the voltage difference between its gate and drain is greater than its threshold voltage, and is turned off when the voltage difference between its gate and drain is smaller than its threshold voltage. Accordingly, the signal φSW fed to the gate of the MOS transistor T7 has an inverted level-shift pattern as compared with the signal φSW in the fifth to eighth embodiments. Moreover, the MOS transistor T7 can be turned on and off without being affected by the MOS transistor T1 that is connected in series with the drain of the MOS transistor T7.

Moreover, since the MOS transistor T7 can be turned on and off without being affected by the MOS transistor T1, there is no need to provide a separate power source for feeding the signal φSW. Furthermore, these circuit configurations permit the MOS transistor T7 to be formed as an enhancement-mode MOS transistor like all the other MOS transistors, and thus allow the MOS transistor T7 to be produced together with the other MOS transistors in a single step. This helps simplify the manufacturing process as compared with the circuit configurations described above in which only the MOS transistor T7 is formed as a depletion-mode MOS transistor.

Ninth Embodiment

Figure 23:
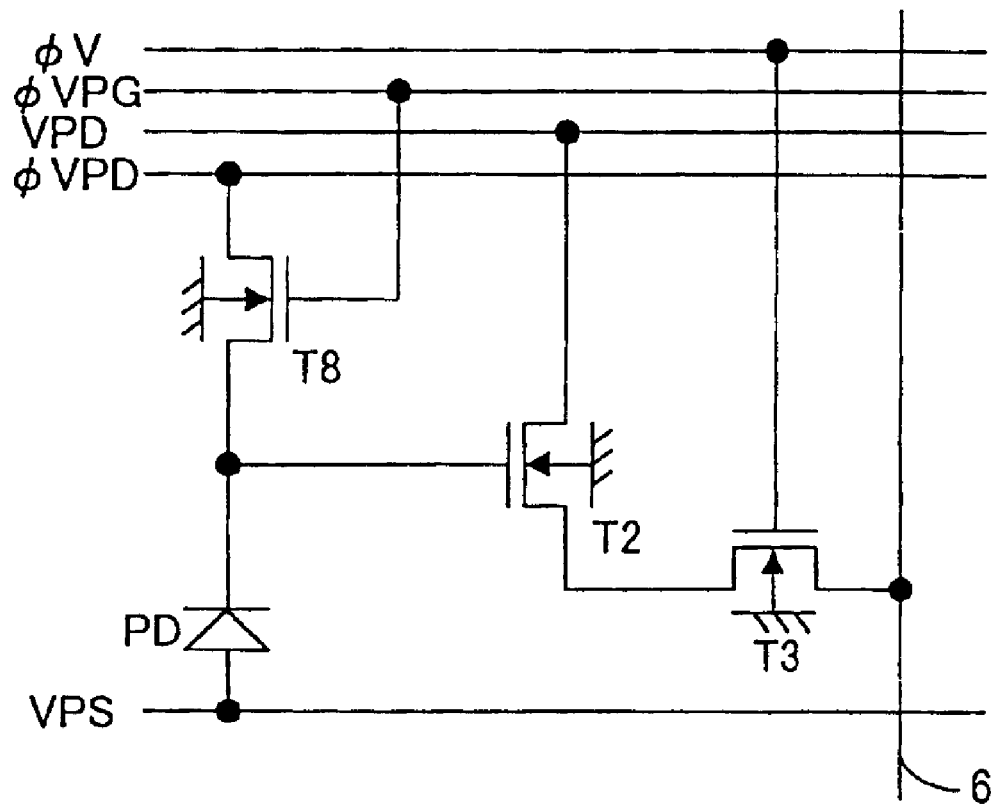
FIG. 23 is a circuit diagram showing an example of the configuration of each pixel in a ninth embodiment of the invention.

Now, a ninth embodiment of the invention will be described with reference to the drawings. FIG. 23 is a circuit diagram showing the configuration of each pixel provided in a solid-state image-sensing device in this embodiment. In the following description, such circuit elements, signal lines, etc. as serve the same purposes as in the pixel shown in FIG. 3 are identified with the same reference numerals or symbols, and their detailed explanations will not be repeated.

As shown in FIG. 23, in this embodiment, the cathode of the photodiode PD is connected to the source of a MOS transistor T8 and to the gate of the MOS transistor T2. The source of the MOS transistor T2 is connected to the drain of the MOS transistor T3 for row selection. The source of the MOS transistor T3 is connected to the output signal line 6 (this output signal line 6 corresponds to the output signal lines 6-1, 6-2, . . . , 6-m shown in FIG. 1). The MOS transistors T2, T3, and T8 are all N-channel MOS transistors with their back gates grounded.

A direct-current voltage VPS is applied to the anode of the photodiode PD, and the direct-current voltage VPD is applied to the drain of the MOS transistor T2. The signal φV is fed to the gate of the MOS transistor T3. A signal φVPD is fed to the drain of the MOS transistor T8, and a signal φVPG is fed to the gate of the MOS transistor T8.

The signal φVPG is a binary voltage signal that takes either a level Va that makes the MOS transistor T8 operate in a subthreshold region when the amount of incident light is above a predetermined level or a level Vb that is higher than the level Va and is used to initialize the source voltage of the MOS transistor T8. The signal φVPD is a binary voltage signal that takes either a high level that is higher than the level Vb or a low level that is lower than the level Va. This pixel configured as described above operates in the following manner.

Figure 24:
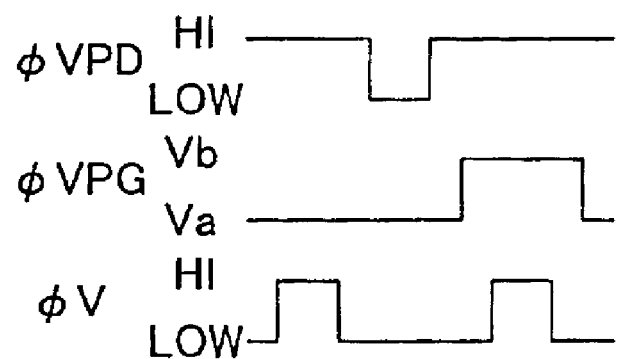
FIG. 24 is a timing chart showing the operation of each pixel in the ninth embodiment.

As shown in a timing chart in FIG. 24, when a pulse is fed as the signal φV to the gate of the MOS transistor T3, an output signal is read out. Then, the signal φVPD is turned to a low level to perform a resetting operation. Now, this resetting operation will be described with reference to the timing chart in FIG. 24 and the potential state transition diagrams of the MOS transistor T8 in FIGS. 25A to 25F.

Figure 25A:
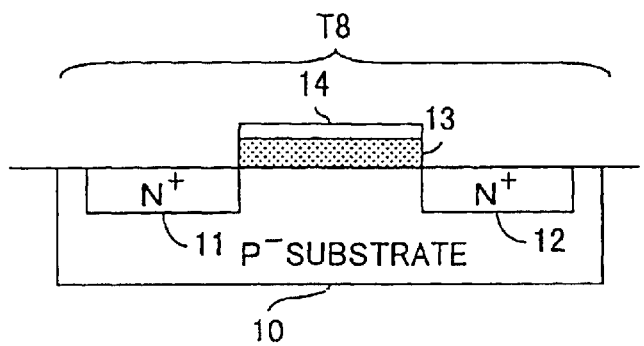
FIGS. 25A to 25F are diagrams showing the structure of the pixel shown in FIG. 23 and the potential relationship observed therein.

Incidentally, as shown in FIG. 25A, the MOS transistor T8 is formed, for example, by forming N-type diffusion layers 11 and 12 in a P-type semiconductor substrate (hereinafter referred to as the "P-type substrate") 10 and then forming, on top of the channel left between those N-type diffusion layers 11 and 12, an oxide film 13 and, further on top thereof, a polysilicon layer 14. Here, the N-type diffusion layers 11 and 12 function as the drain and the source, respectively, of the MOS transistor T8, and the oxide film 13 and the polysilicon layer 14 function as the gate insulating film and the gate electrode, respectively, thereof. Here, in the P-type substrate 10, the region between the N-type diffusion layers 11 and 12 is called the sub-gate region. In FIGS. 25B to 25F, arrows indicate the direction in which the potential increases.

Figure 25B:
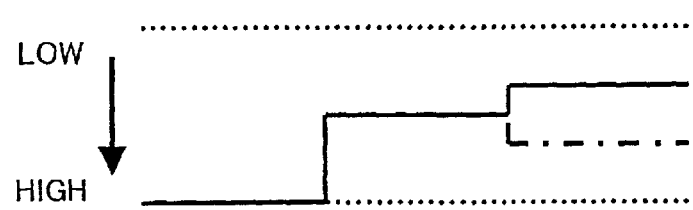
Figure 25C:
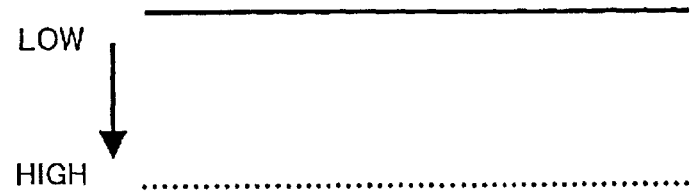

Thus, immediately after an image-sensing operation has been completed, the MOS transistor T8 is, for example, in a potential state as indicated with solid lines in FIG. 25B, in which the source, the sub-gate region, and the drain have increasingly high potentials in this order, or in a potential state as indicated with solid and dash-dot lines in FIG. 25B, in which the sub-gate region, the source, and the drain have increasingly high potentials in this order. In either of these states, when the signal φVPD is turned to a low level, electric charge is injected into the sub-gate region and source of the MOS transistor T8 through the drain thereof, with the result that, as shown in FIG. 25C, the drain, the sub-gate region, and the source all come to have a potential that corresponds to the low level of the signal φVPD. At this point, the signal φVPG is at the level Va.

Figure 25D:
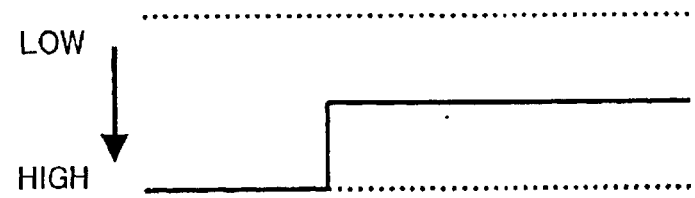

Thereafter, when the signal φVPD is turned back to a high level, as shown in FIG. 25D, the drain of the MOS transistor T8 comes to have a potential that corresponds to the high level of the signal φVPD, and the sub-gate region and the source of the MOS transistor T8 come to have a potential that corresponds to the level Va of the signal φVPG.

Figure 25E:
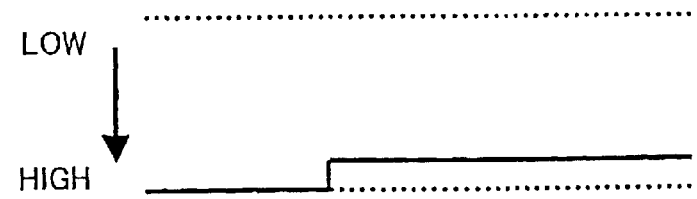

In this state, when the signal φVPG fed to the gate of the MOS transistor T8 is turned from the level Va to the level Vb, as shown in FIG. 25E, the sub-gate region and the source of the MOS transistor T8 come to have a potential that corresponds to the level Vb of the signal φVPG, i.e. a potential higher than their potential in the state shown in FIG. 25D.

In this state, by feeding a high-level pulse as the signal φV to the gate of the MOS transistor T3, a noise signal as obtained during the resetting operation is read out. Here, the source voltage of the MOS transistor T8 in its reset state is fed to the gate of the MOS transistor T2, so that the source voltage of the MOS transistor T8 is current-amplified by the MOS transistor T2, and is then delivered through the MOS transistor T3 to the output signal line 6.

Figure 25F:
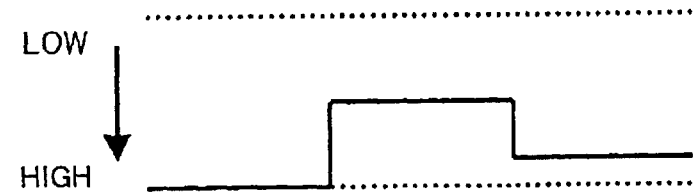

Thereafter, when the signal φVPG fed to the gate of the MOS transistor T8 is turned from the level Vb back to the level Va, as shown in FIG. 25F, the sub-gate region of the MOS transistor T8 comes to have a potential that corresponds to the level Va of the signal φVPG, i.e. a potential lower than its potential in the state shown in FIG. 25E. Thus, the potential at the source of the MOS transistor T8 is now higher than the potential at the sub-gate region thereof. As a result of the signals φVPD and φVPG being manipulated as described above, the potential state of the MOS transistor T8 is reset.

When the signal φVPG is turned to the level Va, an image-sensing operation is started, and an amount of photoelectric charge commensurate with the amount of incident light flows from the photodiode PD into the MOS transistor T8. Now, the gate voltage of the MOS transistor T8 is lower than the source voltage thereof, and therefore the MOS transistor T8 is in a cut-off state. This causes the photoelectric charge to be accumulated at the source of the MOS transistor T8. Thus, if the brightness of the subject being sensed is low and the amount of light incident on the photodiode PD is small, a voltage commensurate with the amount of photoelectric charge accumulated at the source of the MOS transistor T8 appears at the source of the MOS transistor T8. As a result, a voltage linearly proportional to the integral of the amount of incident light appears at the source of the MOS transistor T8. Here, since the photoelectric charge that is generated in the photodiode PD is negative, the more intense the incident light, the lower the source voltage of the MOS transistor T8.

By contrast, if the brightness of the subject being sensed is high and the amount of light incident on the photodiode PD is large, the MOS transistor T8 operates in a subthreshold region. As a result, a voltage natural-logarithmically proportional to the amount of incident light appears at the source of the MOS transistor T8.

When a voltage linearly or natural-logarithmically proportional to the amount of incident light appears at the gate of the MOS transistor T2 in this way, in the same manner as described above, a pulse is fed as the signal φV to the gate of the MOS transistor T3. As a result, the source voltage of the MOS transistor T8, which is linearly or natural-logarithmically proportional to the amount of incident light, is current-amplified by the MOS transistor T2, and is then delivered through the MOS transistor T3 to the output signal line 6. Moreover, the drain voltage of the MOS transistor Q1, which is determined by the on-state resistances of the MOS transistor T2 and the MOS transistor Q1 and the current flowing therethrough, appears as an image signal on the output signal line 6. After the image signal is read out in this way, the resetting operation described earlier is performed.

Among the individual pixels each operating as described above, the threshold voltage of the MOS transistor T8 varies from one pixel to another, and therefore, when the signal φVPG is at the level Va, the voltage at which a switching from linear conversion to logarithmic conversion takes place is Va+Vx (where Vx represents the component of the voltage that results from a variation in the threshold voltage of the MOS transistor T8). In this embodiment, when the signal φVPG is at the level Vb, the voltage at the source electrode of the MOS transistor T8 is substantially equal to Vb+Vx in practical terms. Thus, the difference is ΔV=Vb−Va; that is, the amount of electric charge that is required to effect a transition from a reset state to the aforementioned switching point is substantially constant irrespective of variations in the threshold voltage of the MOS transistor T8 among the individual pixels.

Therefore, the amount of photoelectric charge that flows into the MOS transistor T8 before the source voltage of the MOS transistor T8 reaches the voltage at which a switching to logarithmic conversion takes place is equal in all the pixels. Thus, the amount of electric charge that is generated in the photodiode PD when a switching to logarithmic conversion takes place is equal in all the pixels, and therefore the amount of light incident on the photodiode PD when a switching to logarithmic conversion takes place is equal in all the pixels. That is, in all the pixels, the brightness of the subject at which a switching from linear conversion to logarithmic conversion takes place is equal. In this way, it is possible to reduce the effect of variations in the threshold voltage of the MOS transistor T8 among the individual pixels on their switching from one type of conversion to another.

By varying the level Vb of the signal φVPG in the resetting operation, it is possible to vary the range in which the gate voltage VS of the MOS transistor T8 is allowed to vary in linear conversion. Thus, by varying the level Vb of the signal φVPG in the resetting operation, it is possible to set the switching point, which corresponds to the brightness of the subject at which a switching from linear conversion to logarithmic conversion takes place in the individual pixels, at the desired level.

The noise signals from the individual pixels are fed out by way of the signal line 9 shown in FIG. 1, serially from one pixel after another, so as to be stored as pixel-by-pixel noise signals in a memory provided in the succeeding circuit. Then, the image signals from the individual pixels are corrected with the noise signals thus stored. In this way, it is possible to eliminate, from the image signals, components resulting from variations in characteristics among the individual pixels. A practical example of how this correction is achieved is shown in FIG. 50 and will be described later. Alternatively, similar correction may be realized by providing memories, such as line memories, within the pixels. In this embodiment, first the signal φVPD is turned to a low level and then the signal φVPG is turned to a high level. However, these signals may be manipulated otherwise than specifically described above; for example, the signal φVPD may be turned to a low level while the signal VPG is kept at a high level.

Tenth Embodiment

Figure 26:
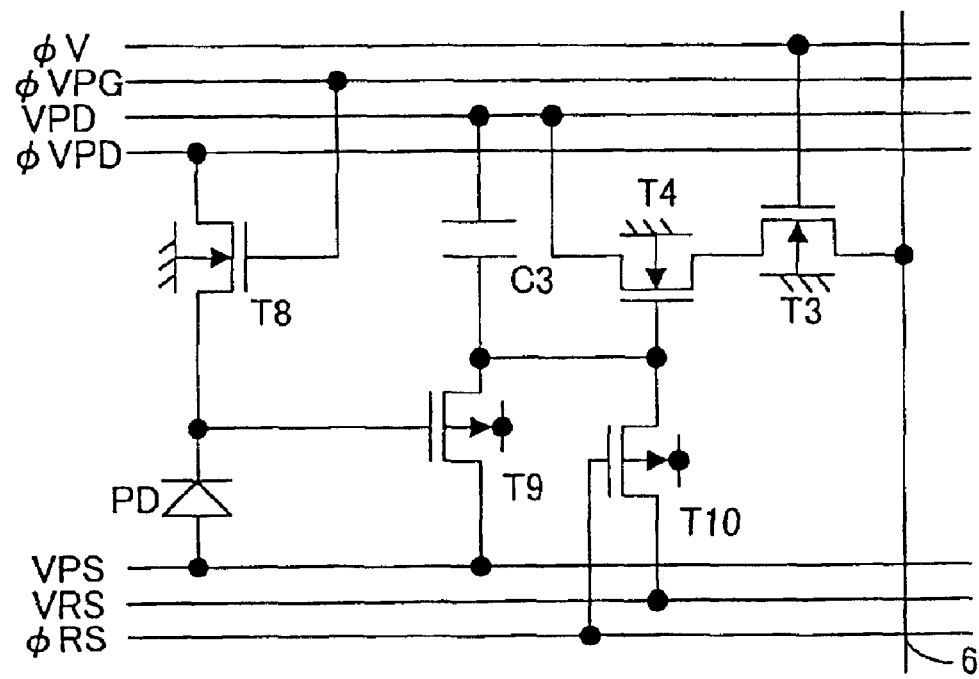
FIG. 26 is a circuit diagram showing an example of the configuration of each pixel in a tenth embodiment of the invention.

Now, a tenth embodiment of the invention will be described with reference to the drawings. FIG. 26 is a circuit diagram showing the configuration of each pixel provided in a solid-state image-sensing device in this embodiment. In the following description, such circuit elements, signal lines, etc. as serve the same purposes as in the pixel shown in FIG. 23 are identified with the same reference numerals or symbols, and their detailed explanations will not be repeated.

As shown in FIG. 26, the pixel of this embodiment is obtained by additionally providing, in the pixel of the ninth embodiment (FIG. 23), MOS transistors T4, T9, and T10 and a capacitor C3. The MOS transistor T9 has its gate connected to the anode of the photodiode PD and to the source of the MOS transistor T8, and has its source connected to one end of the capacitor C3, which receives the direct-current voltage VPD at the other end. The node between the source of the MOS transistor T9 and the capacitor C3 is connected to the gate of the MOS transistor T4 and to the source of the MOS transistor T10. The MOS transistors T9 and T10 are P-channel MOS transistors with the supply voltage applied to their back gates.

The direct-current voltage VPD is applied to the drain of the MOS transistor T4, and the direct-current voltage VPS is applied to the drain of the MOS transistor T9. A direct-current voltage VRS is applied to the drain of the MOS transistor T10, and a signal φRS is fed to the gate of the MOS transistor T10. The source of the MOS transistor T4 is connected to the drain of MOS transistor T3. This pixel configured as described above operates in the following manner.

Figure 27:
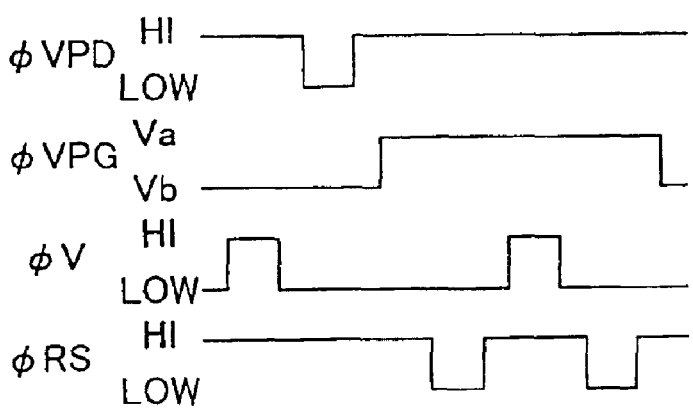
FIG. 27 is a timing chart showing the operation of each pixel in the tenth embodiment.

As shown in a timing chart in FIG. 27, when a pulse is fed as the signal φV to the gate of the MOS transistor T3, an output signal is read out. Then, the signal φVPD is turned to a low level to perform a resetting operation. As a result, the drain, the sub-gate region, and the source of the MOS transistor T8 come to have a potential that corresponds to the low level of the signal φVPD. Thereafter, when the signal φVPD is turned back to a high level, the drain of the MOS transistor T8 comes to have a potential that corresponds to the high level of the signal φVPD, and the sub-gate region and the source of the MOS transistor T8 come to have a potential that corresponds to the voltage Va of the signal φVPG.

In this state, when the signal φVPG fed to the gate of the MOS transistor T8 is turned from the level Va to the level Vb, the sub-gate region and the source of the MOS transistor T8 come to have a potential that corresponds to the level Vb of the signal φVPG. Then, a low-level pulse is fed as the signal φRS to the gate of the MOS transistor T10 to charge the capacitor C3. This initializes the voltage at the node between the capacitor C3 and the source of the MOS transistor T9.

In this state, by feeding a high-level pulse as the signal φV to the gate of the MOS transistor T3, a noise signal as obtained during the resetting operation is read out. Here, a voltage commensurate with the source voltage of the MOS transistor T8 in its reset state is fed to the gate of the MOS transistor T4. This voltage is current-amplified by the MOS transistor T4, and is then delivered through the MOS transistor T3 to the output signal line 6. After the noise signal is read out in this way, a low-level pulse is fed as the signal φRS to the gate of the MOS transistor T10 again to initialize the voltage at the node between the capacitor C3 and the source of the MOS transistor T9.

Thereafter, when the signal φVPG fed to the gate of the MOS transistor T8 is turned from the level Vb back to the level Va, the sub-gate region of the MOS transistor T8 comes to have a potential that corresponds to the level Va of the signal φVPG. Thus, the potential at the source of the MOS transistor T8 is now higher than the potential at the sub-gate region thereof. As a result of the signals φVPD and φVPG being manipulated as described above, the potential state of the MOS transistor T8 is reset.

When the signal φVPG is turned to the level Va, an image-sensing operation is started, and a voltage linearly or natural-logarithmically proportional to the amount of light incident on the photodiode PD appears at the source of the MOS transistor T8 and at the gate of the MOS transistor T9. Here, since the photoelectric charge that is generated in the photodiode PD is negative, the more intense the incident light, the lower the source voltage of the MOS transistor T8.

When a voltage linearly or natural-logarithmically proportional to the photocurrent appears at the gate of the MOS transistor T9 in this way, the positive electric charge accumulated in the capacitor C3, which is now higher than the surface potential determined by the gate voltage of the MOS transistor T9 when the MOS transistor T9 is reset, flows through the MOS transistor T9. Here, the amount of positive electric charge that flows out of the capacitor C3 is determined by the gate voltage of the MOS transistor T9. Specifically, the more intense the incident light, the lower the source voltage of the MOS transistor T8, and thus the larger the amount of positive electric charge that flows out of the capacitor C3.

As a result of the positive electric charge flowing out of the capacitor C3 in this way, the voltage at the node between the capacitor C3 and the source of the MOS transistor T9 is now linearly or natural-logarithmically proportional to the integral of the amount of incident light. Thus, when a pulse is fed as the signal φV to the MOS transistor T3 to turn the MOS transistor T3 on, a current linearly or natural-logarithmically proportional to the integral of the aforementioned photocurrent is delivered through the MOS transistors T3 and T4 to the output signal line 6. In this way, a signal (output current) linearly or natural-logarithmically proportional to the amount of incident light is read out, and then the MOS transistor T3 is turned off. After an image signal is read out in this way, the resetting operation described earlier is performed.

While the image-sensing operation is being performed in this way, as in the ninth embodiment, the source voltage VS of the MOS transistor T8 is converted into a voltage linearly proportional to the integral of the amount of incident light or a voltage natural-logarithmically proportional to the integral of the amount of incident light, and is fed to the gate of the MOS transistor T9.

With each pixel configured as described above, by varying the level Vb of the signal φVPG in the resetting operation, it is possible to vary the brightness of the subject at which a switching from linear conversion to logarithmic conversion takes place in the individual pixels. Moreover, in this embodiment, the use of the capacitor C3 makes it possible to integrate the output signal before it is fed out. The capacitor C3 absorbs and eliminates, from the output signal, undesirable components such as fluctuation originating from a light source and high-frequency noise. Thus, it is possible to obtain output signals with a satisfactory S/N ratio.

The noise signals from the individual pixels are fed out by way of the signal line 9 shown in FIG. 1, serially from one pixel after another, so as to be stored as pixel-by-pixel noise signals in a memory provided in the succeeding circuit. Then, the image signals from the individual pixels are corrected with the noise signals thus stored. In this way, it is possible to eliminate, from the image signals, components resulting from variations in characteristics among the individual pixels. A practical example of how this correction is achieved is shown in FIG. 50 and will be described later. Alternatively, similar correction may be realized by providing memories, such as line memories, within the pixels.

Eleventh Embodiment

Figure 28:
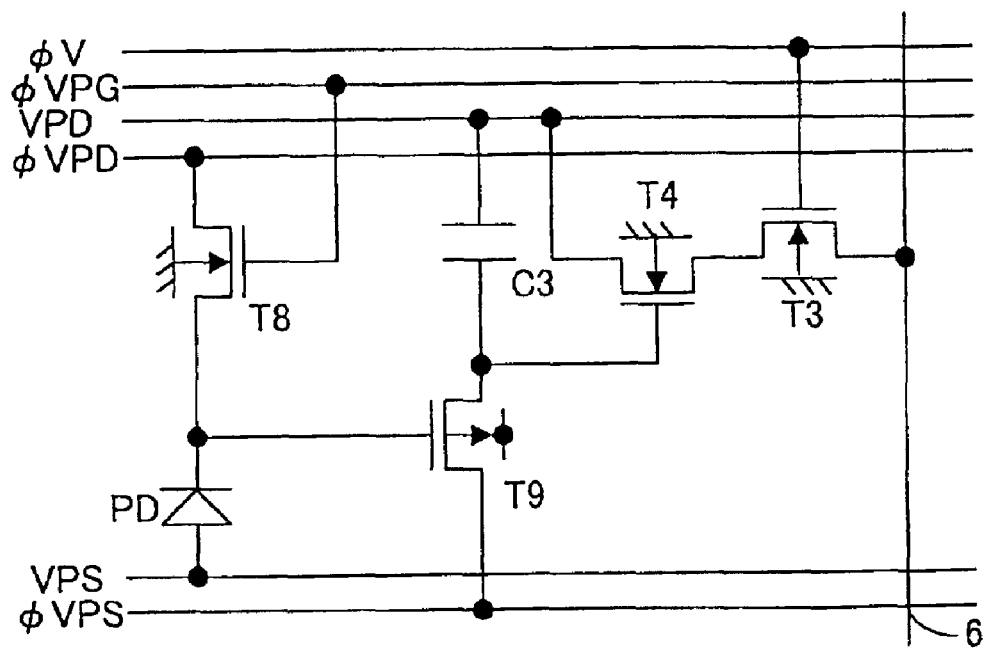
FIG. 28 is a circuit diagram showing an example of the configuration of each pixel in an eleventh embodiment of the invention.

Now, an eleventh embodiment of the invention will be described with reference to the drawings. FIG. 28 is a circuit diagram showing the configuration of each pixel provided in a solid-state image-sensing device in this embodiment. In the following description, such circuit elements, signal lines, etc. as serve the same purposes as in the pixel shown in FIG. 26 are identified with the same reference numerals or symbols, and their detailed explanations will not be repeated.

As shown in FIG. 28, the pixel of this embodiment is obtained by omitting the MOS transistor T10 from the pixel of the tenth embodiment (FIG. 26). Specifically, the signal φVPS is fed to the drain of the MOS transistor T9. In this configuration, the resetting of the voltage at the node between the capacitor C3 and the source of the MOS transistor T9 is achieved through the MOS transistor T9. In other respects, how the pixel of this embodiment operates is the same as described earlier in connection with the tenth embodiment, and therefore will not be described anew.

In this embodiment, the voltage at the node between the capacitor C3 and the source of the MOS transistor T9 is reset by feeding a high-level pulse as the signal φVPS to the drain of the MOS transistor T9. The omission of the MOS transistor T10 makes the pixel configuration of this embodiment simpler than that of the tenth embodiment.

The noise signals from the individual pixels are fed out by way of the signal line 9 shown in FIG. 1, serially from one pixel after another, so as to be stored as pixel-by-pixel noise signals in a memory provided in the succeeding circuit. Then, the image signals from the individual pixels are corrected with the noise signals thus stored. In this way, it is possible to eliminate, from the image signals, components resulting from variations in characteristics among the individual pixels. A practical example of how this correction is achieved is shown in FIG. 50 and will be described later. Alternatively, similar correction may be realized by providing memories, such as line memories, within the pixels.

In any of the embodiments described hereinbefore, the reading of the signal from each pixel may be achieved by the use of a charge-coupled device (CCD). In that case, the transfer of an electric charge to the CCD is achieved by providing a potential barrier with a variable potential level that corresponds to the MOS transistor T4. In the embodiments described hereinbefore, photodiodes are used as photosensitive elements; however, phototransistors, or photosensitive elements of any other type, may be used instead. In the second, third, sixth, and seventh embodiments, the resetting of the capacitor C1 is achieved through the MOS transistor T2; however, it is also possible to provide a separate MOS transistor dedicated to the resetting of the capacitor C1.

In the first to ninth embodiments described hereinbefore, the MOS transistors Ti to T8 provided within each pixel as active elements are all formed as N-channel MOS transistors; however, these MOS transistors T1 to T8 may all be formed as P-channel MOS transistors instead. On the other hand, in the tenth and eleventh embodiments, it is possible, within each pixel, to replace all the N-channel MOS transistors with P-channel MOS transistors and replace all the P-channel MOS transistors with N-channel MOS transistors.

Figure 48:
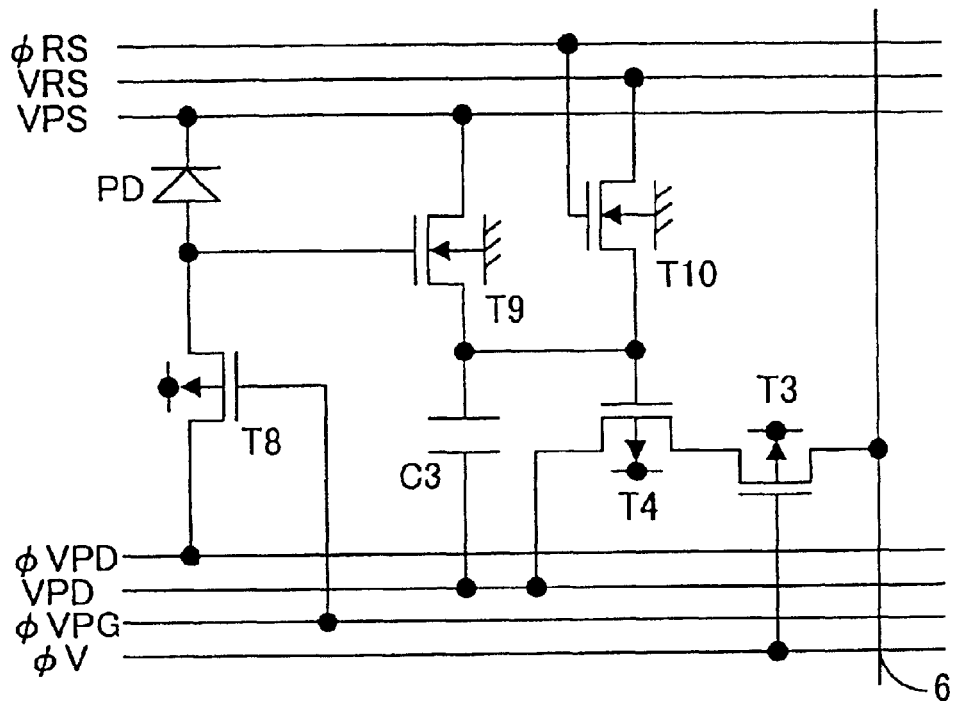
FIG. 48 is a circuit diagram showing an example of the configuration of each pixel in a twenty-first embodiment of the invention.
Figure 49:
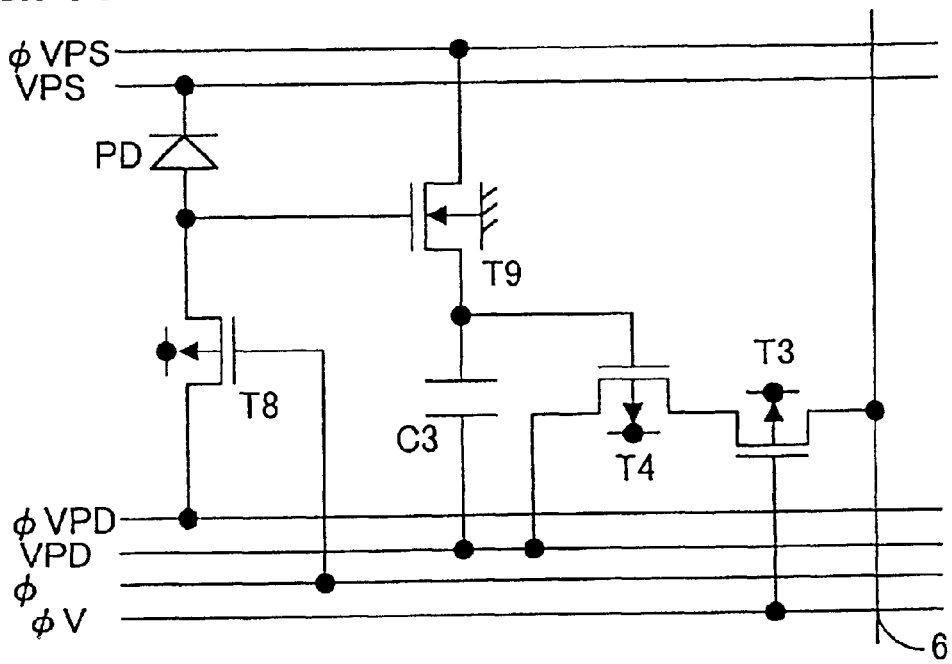
FIG. 49 is a circuit diagram showing an example of the configuration of each pixel in a twenty-second embodiment of the invention.

FIGS. 31 to 38 and 47 show twelfth to twentieth embodiments of the invention, which are examples of modified versions of the first to ninth embodiments described hereinbefore in which P-type MOS transistors are used. FIGS. 48 and 49 show twenty-first and twenty-second embodiments of the invention, which are examples of modified versions of the tenth and eleventh embodiments described hereinbefore in which MOS transistors of opposite polarity types are used. FIGS. 39 to 42 show modified versions of the sixteenth to nineteenth embodiments in which a depletion-mode P-channel MOS transistor is used as the MOS transistor T7. FIGS. 43 to 46 show modified versions of the sixteenth to nineteenth embodiments in which an N-channel MOS transistor is used as the MOS transistor T7. Accordingly, in FIGS. 29 to 49, all the elements used and the voltages applied have the opposite polarities. For example, in FIG. 31 (the twelfth embodiment), the photodiode PD has its anode connected to the direct-current voltage VPD, and has its cathode connected to the drain and gate of the MOS transistor T1 and to the gate of the MOS transistor T2. The MOS transistor T1 receives the signal φVPS at its source.

Figure 31:
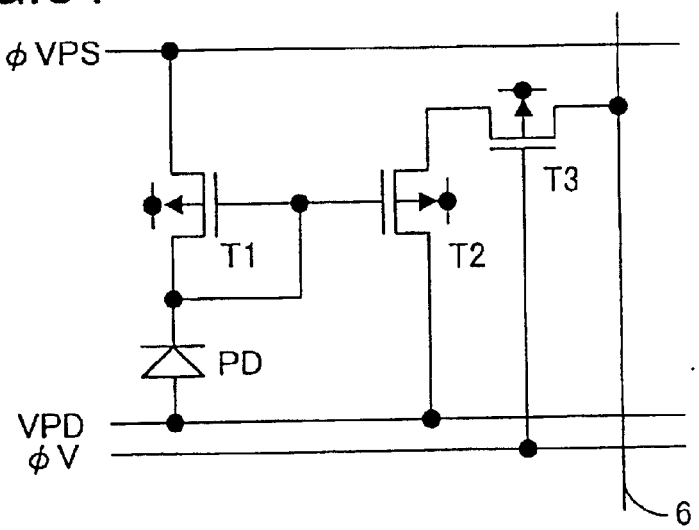
FIG. 31 is a circuit diagram showing an example of the configuration of each pixel in a twelfth embodiment of the invention.
Figure 32:
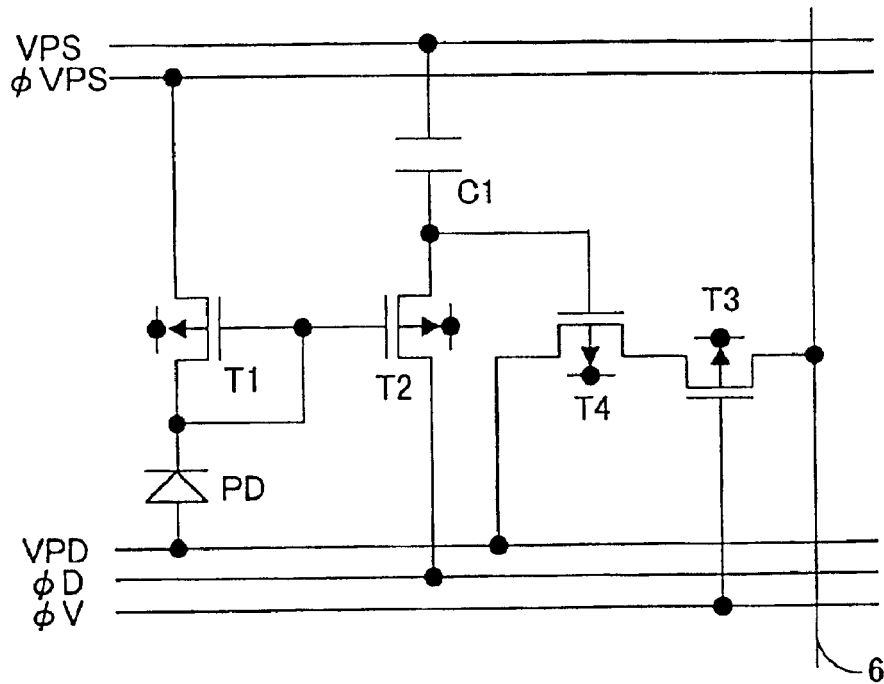
FIG. 32 is a circuit diagram showing an example of the configuration of each pixel in a thirteenth embodiment of the invention.
Figure 33:
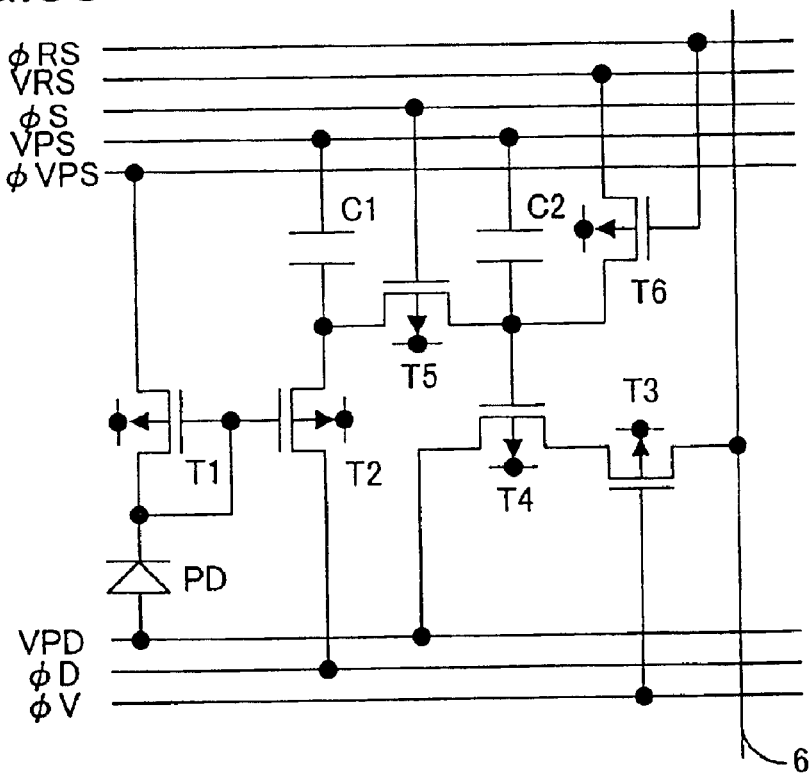
FIG. 33 is a circuit diagram showing an example of the configuration of each pixel in a fourteenth embodiment of the invention.
Figure 34:
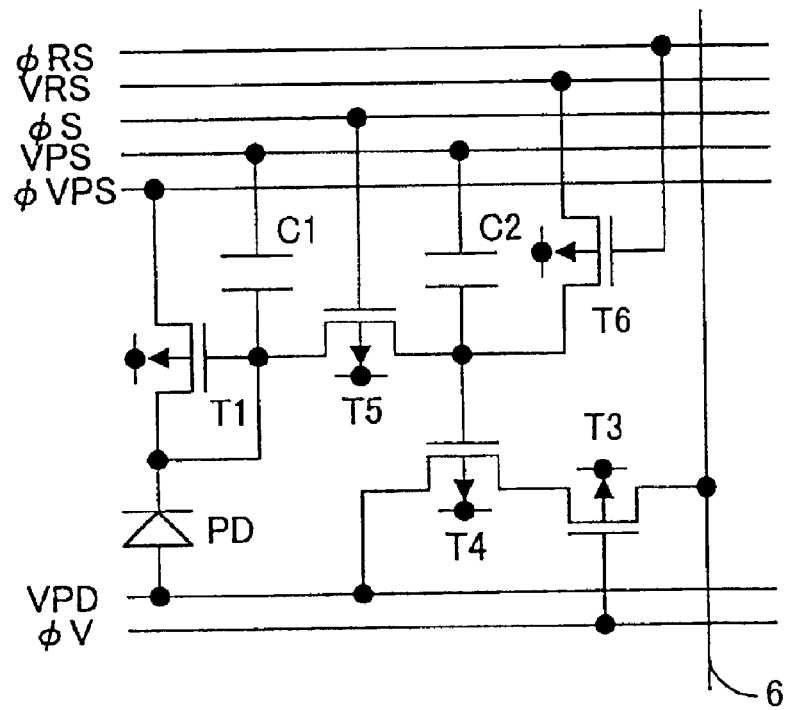
FIG. 34 is a circuit diagram showing an example of the configuration of each pixel in a fifteenth embodiment of the invention.
Figure 35:
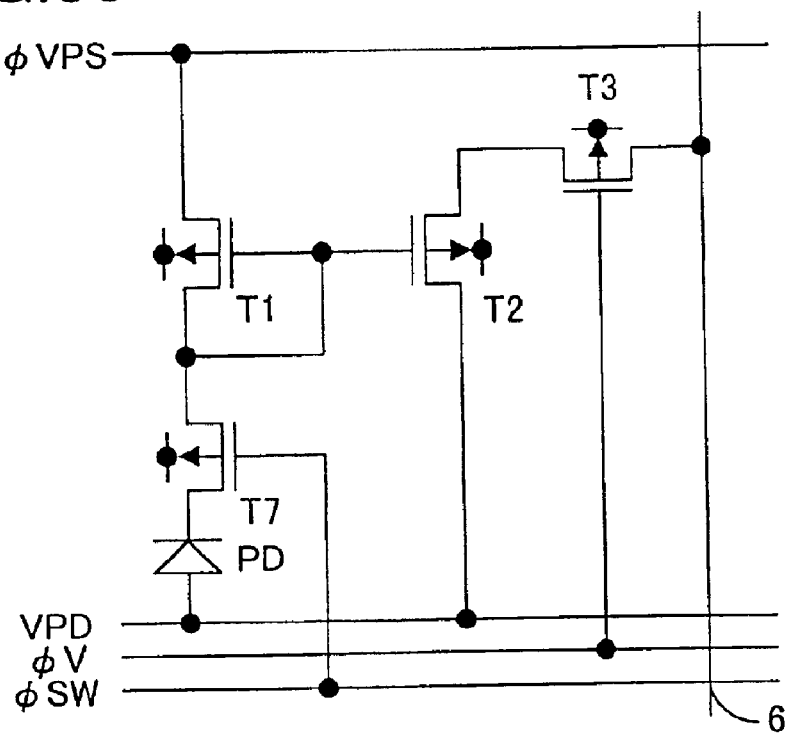
FIG. 35 is a circuit diagram showing an example of the configuration of each pixel in a sixteenth embodiment of the invention.
Figure 36:
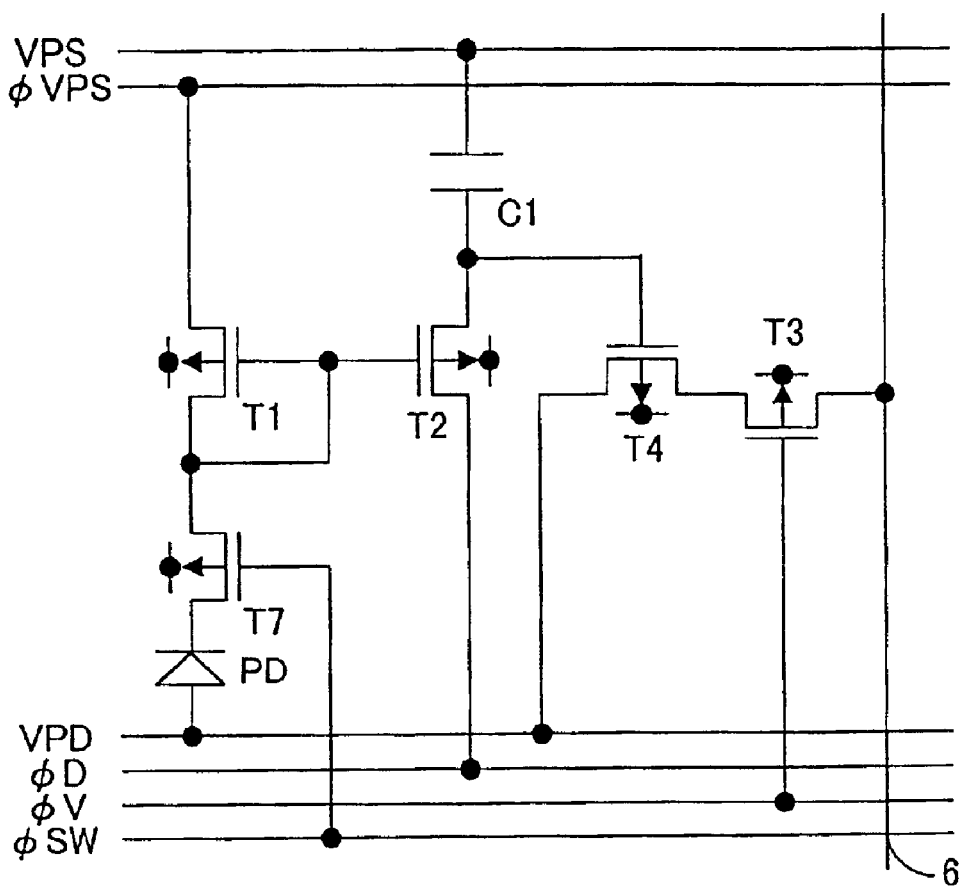
FIG. 36 is a circuit diagram showing an example of the configuration of each pixel in a seventeenth embodiment of the invention.
Figure 37:
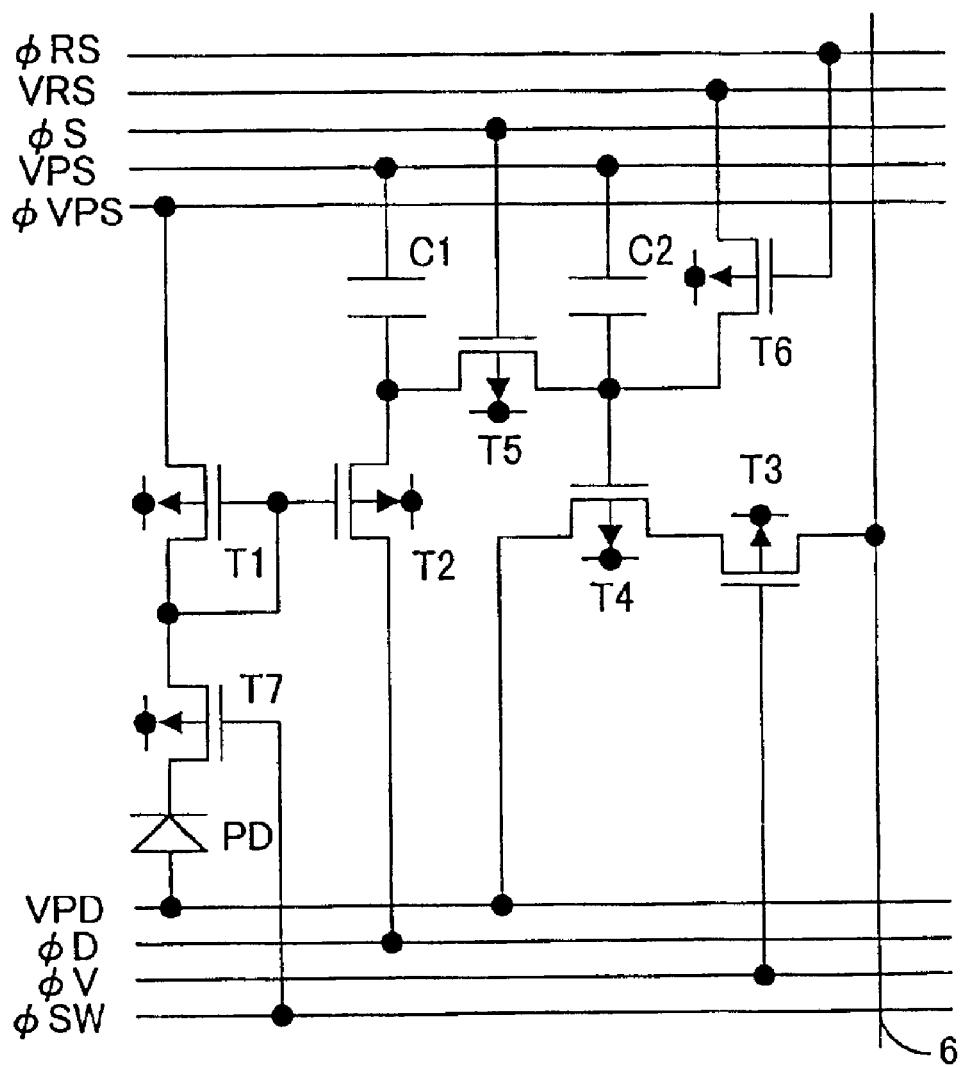
FIG. 37 is a circuit diagram showing an example of the configuration of each pixel in an eighteenth embodiment of the invention.
Figure 38:
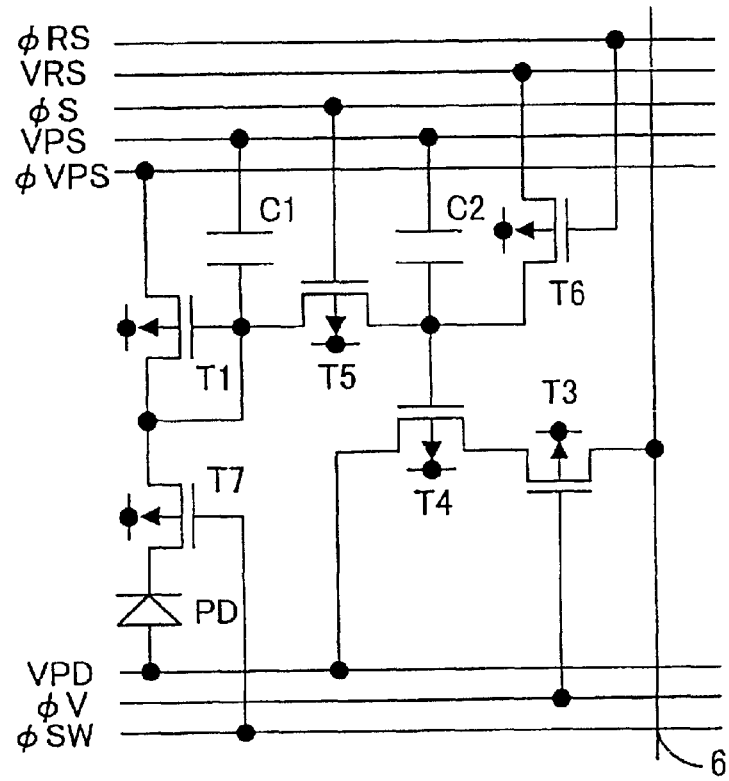
FIG. 38 is a circuit diagram showing an example of the configuration of each pixel in a nineteenth embodiment of the invention.
Figure 39:
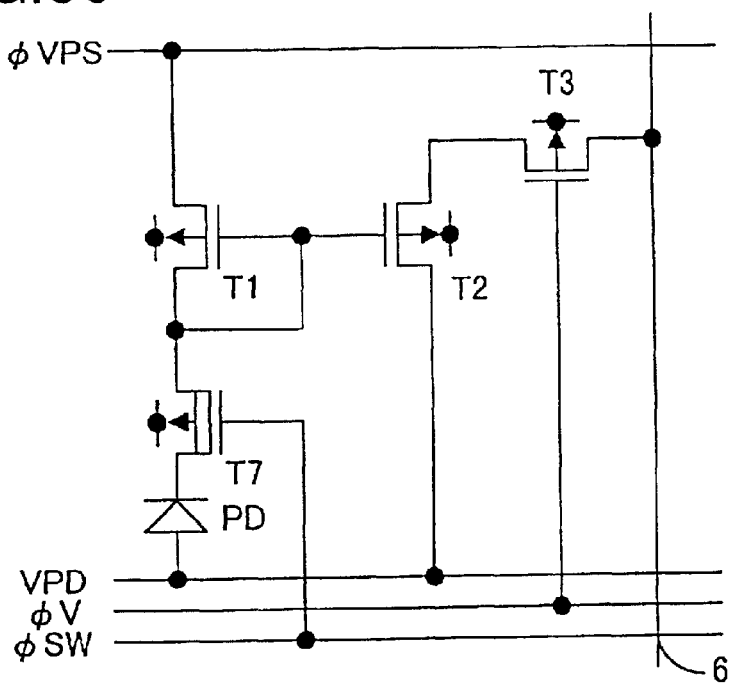
FIG. 39 is a circuit diagram showing another example of the configuration of each pixel in a sixteenth embodiment of the invention.
Figure 40:
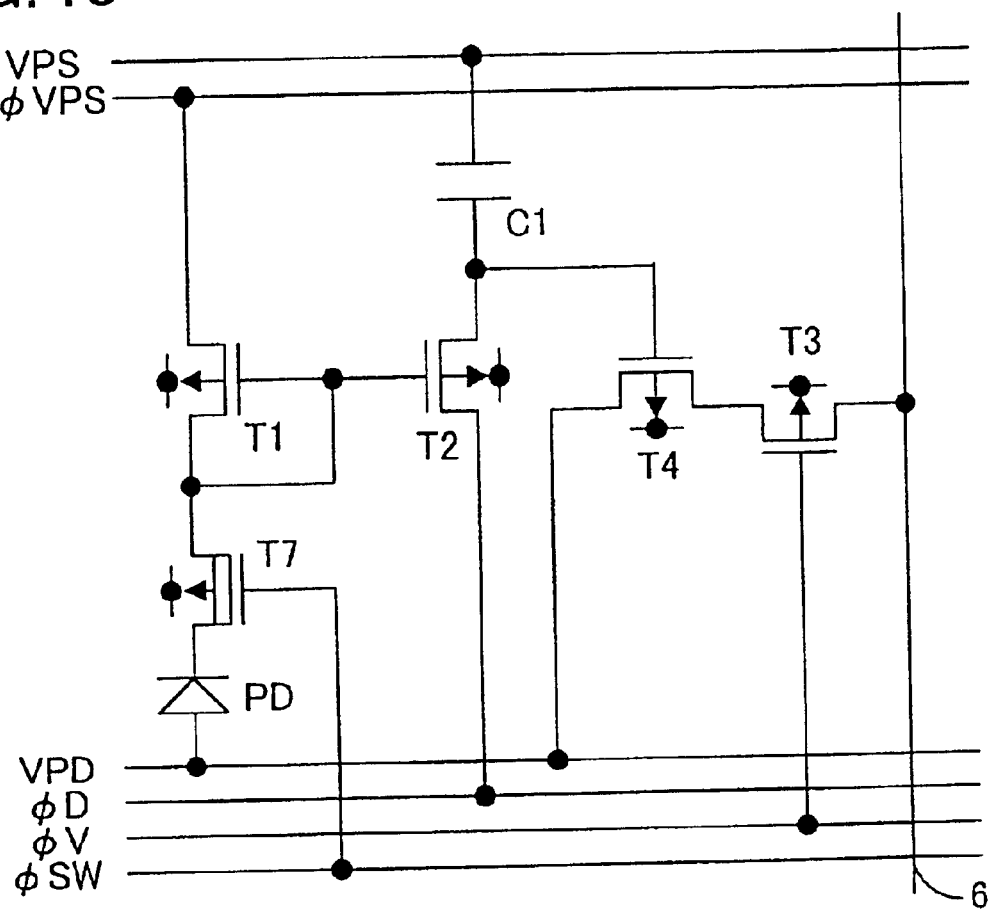
FIG. 40 is a circuit diagram showing another example of the configuration of each pixel in a seventeenth embodiment of the invention.
Figure 41:
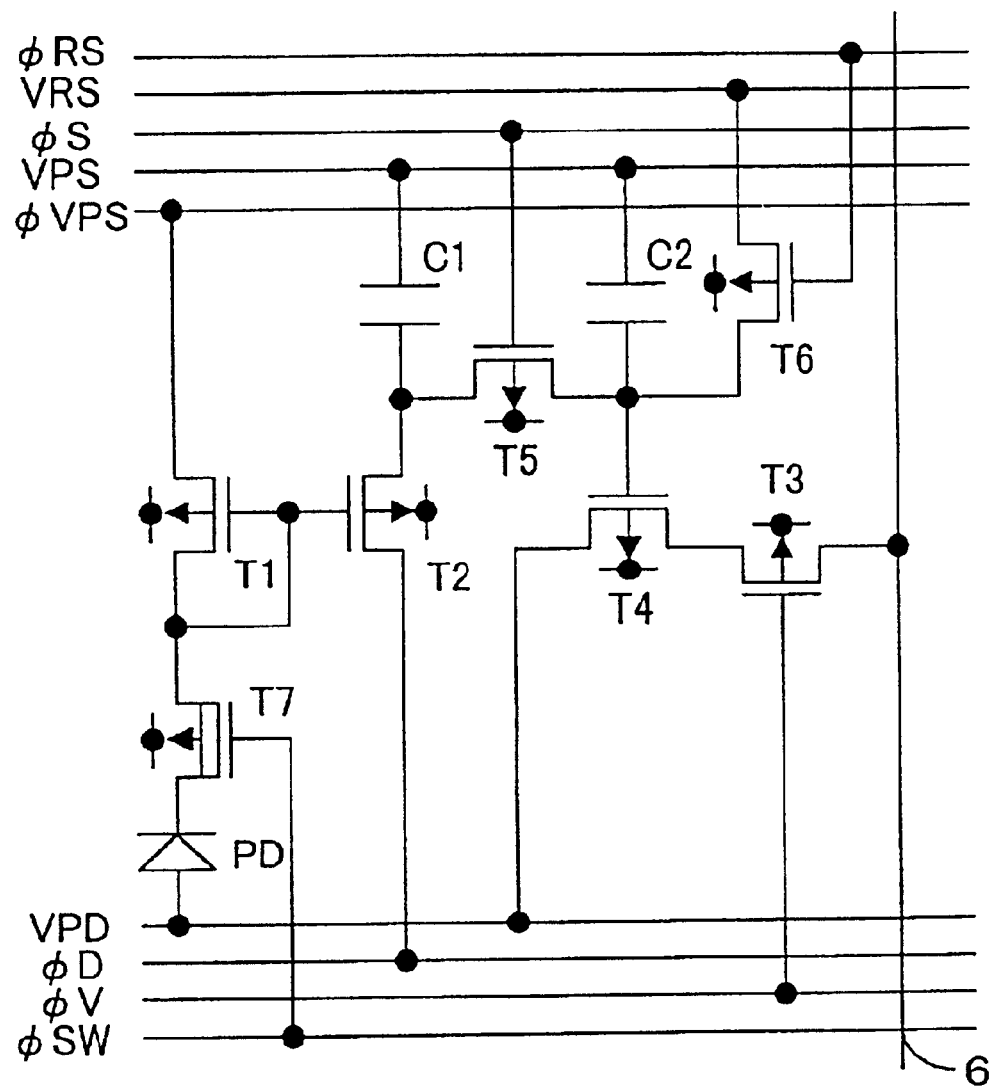
FIG. 41 is a circuit diagram showing another example of the configuration of each pixel in an eighteenth embodiment of the invention.
Figure 42:
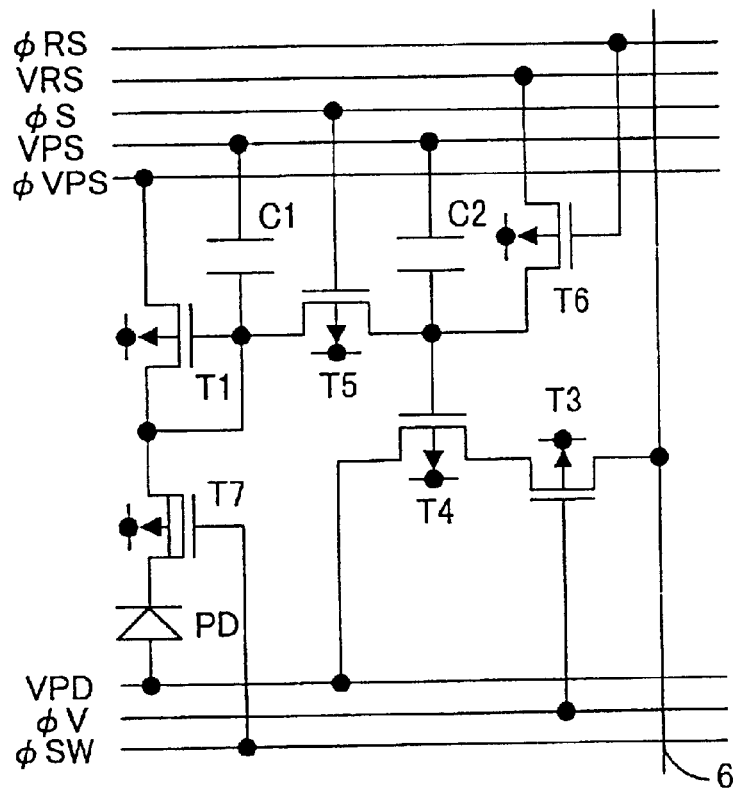
FIG. 42 is a circuit diagram showing another example of the configuration of each pixel in a nineteenth embodiment of the invention.
Figure 43:
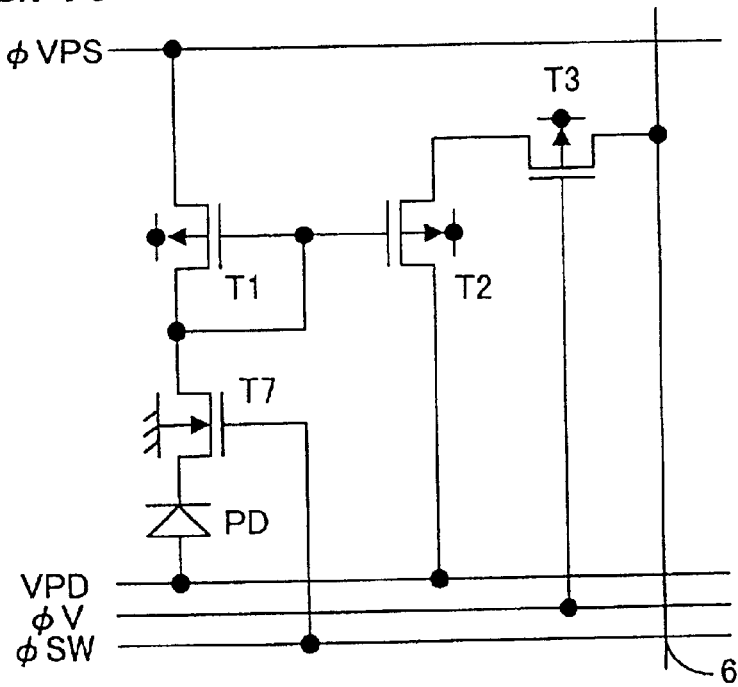
FIG. 43 is a circuit diagram showing another example of the configuration of each pixel in a sixteenth embodiment of the invention.
Figure 44:
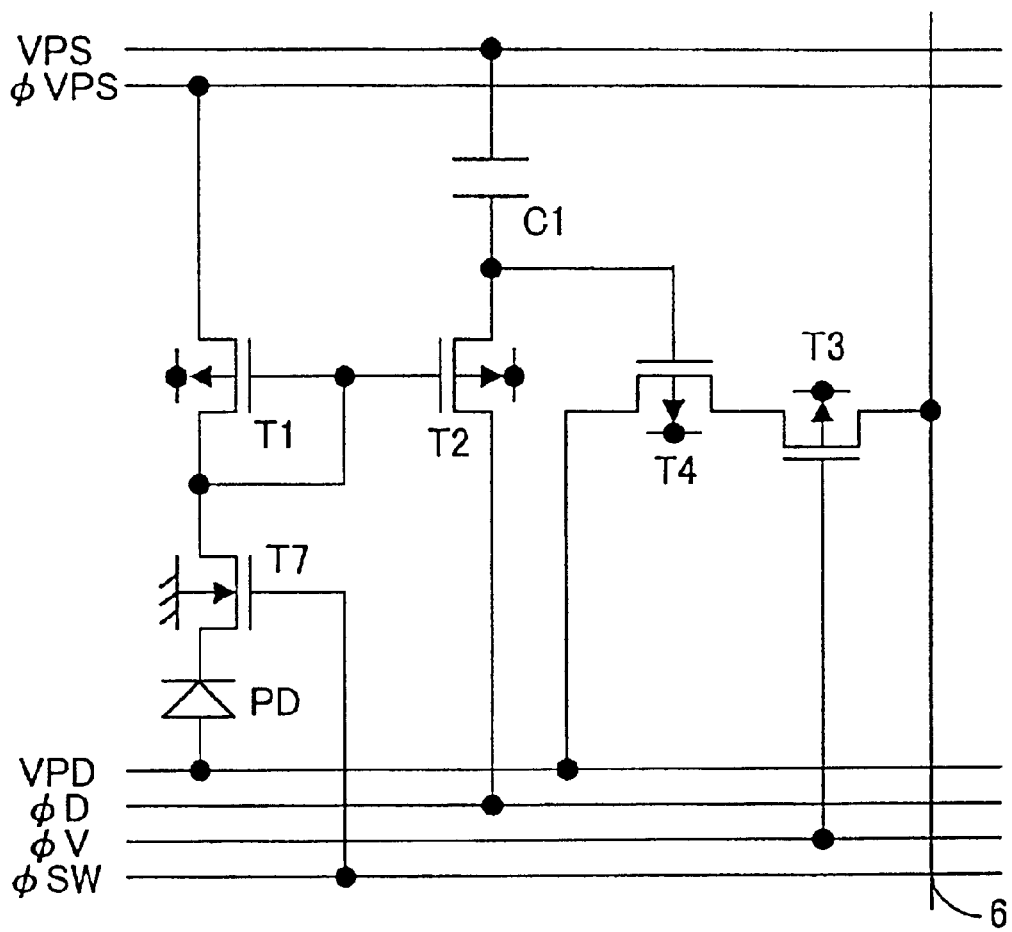
FIG. 44 is a circuit diagram showing another example of the configuration of each pixel in a seventeenth embodiment of the invention.
Figure 45:
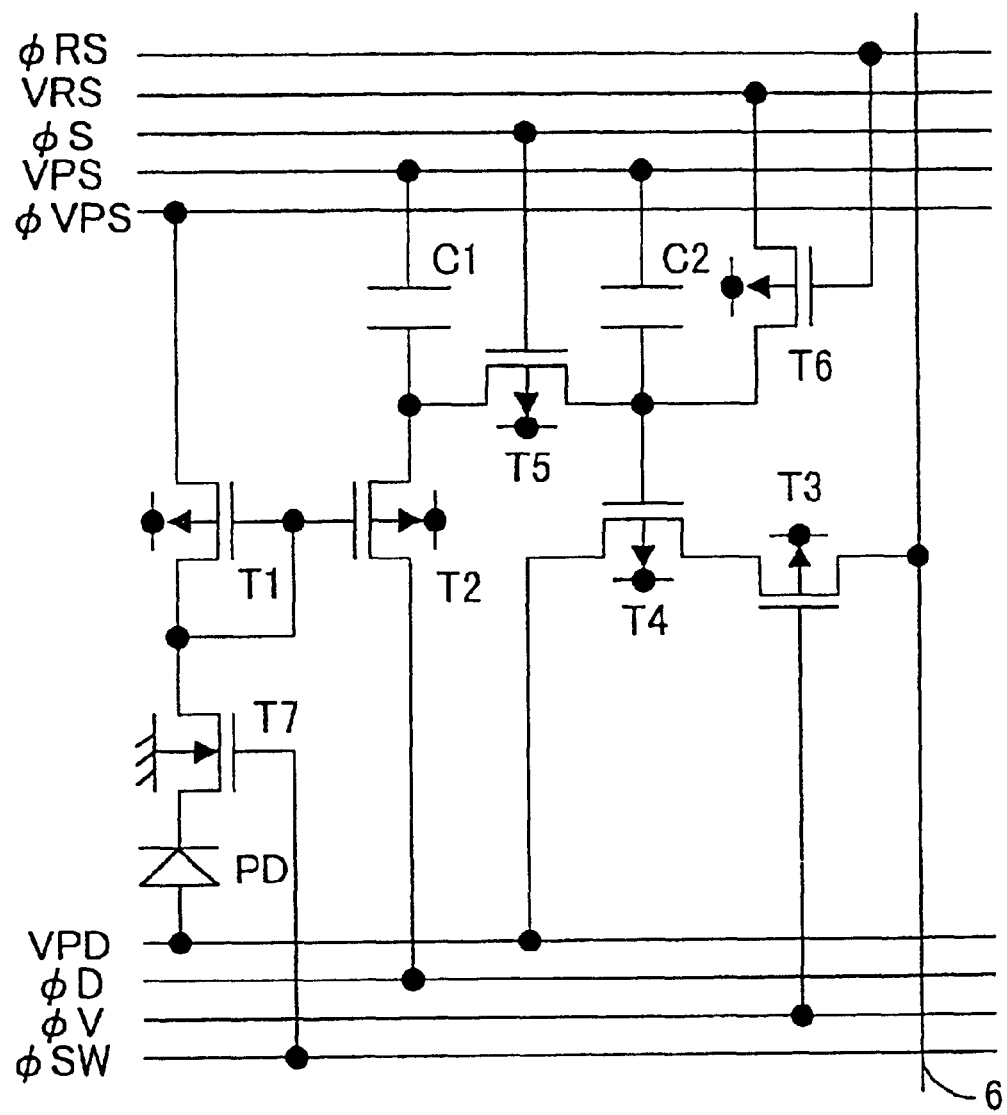
FIG. 45 is a circuit diagram showing another example of the configuration of each pixel in an eighteenth embodiment of the invention.
Figure 46:
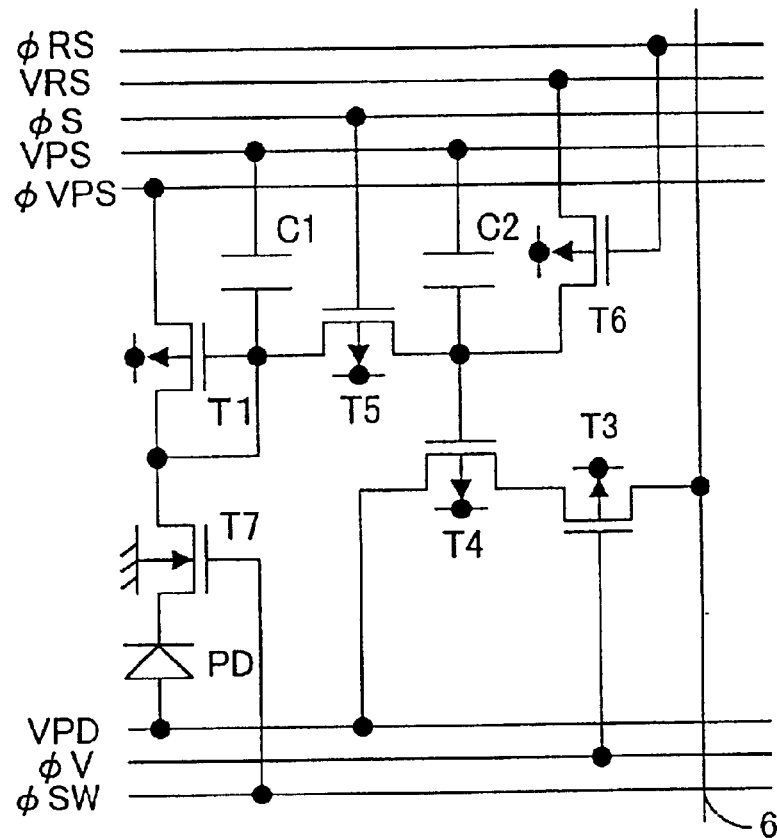
FIG. 46 is a circuit diagram showing another example of the configuration of each pixel in a nineteenth embodiment of the invention.
Figure 47:
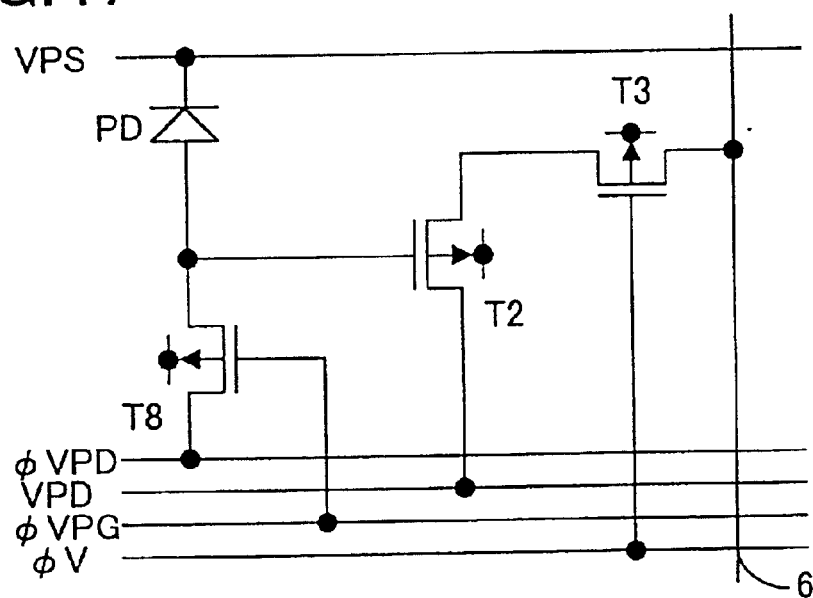
FIG. 47 is a circuit diagram showing an example of the configuration of each pixel in a twentieth embodiment of the invention.

When logarithmic conversion is performed in the pixel configured as shown in FIG. 31, the direct-current voltage VPS and the direct-current voltage VPD fulfill the relation VPS>VPD, thus an inverted relation as compared with the case shown in FIG. 3 (the first embodiment). In the pixel configured as shown in FIG. 32, the output voltage of the capacitor C1 is initially high, and drops as a result of integration. Moreover, when one of the MOS transistors T3 to T7 is turned on, a low voltage is applied to the gate thereof. In the pixels configured as shown in FIGS. 43 to 46, when the MOS transistor T7, which is an N-channel MOS transistor, is turned on, a high voltage is applied to the gate thereof. In the pixel configured as shown in FIG. 48 (the twenty-first embodiment), when the MOS transistor T10 is turned on, a low voltage is applied to the gate thereof. In this way, in cases where MOS transistors of opposite polarity types are used, although how the voltages are applied and the elements are connected differs partially, the circuits are configured substantially in the same manner and operate basically in the same manner. Therefore, with respect to the twelfth to twenty-second embodiments, only illustrations are given in FIGS. 31 to 49, and their configuration and operation will not be described anew.

Figure 29:
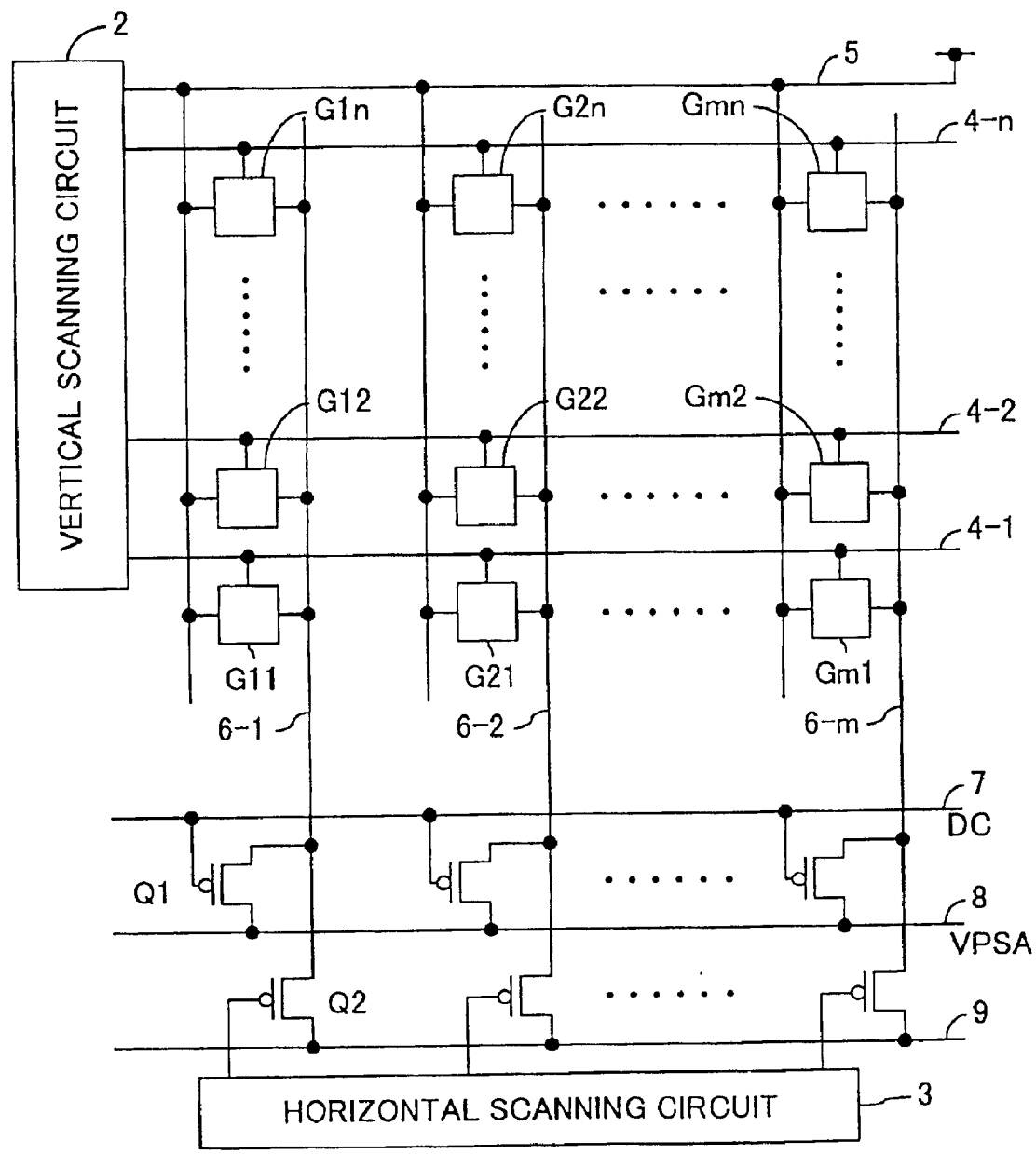
FIG. 29 is a block diagram illustrating the overall configuration of a two-dimensional solid-state image-sensing device embodying the invention, in a case where P-channel MOS transistors are used as active elements in each pixel.

FIG. 29 is a block circuit configuration diagram illustrating the overall configuration of a solid-state image-sensing device having pixels configured according to one of the twelfth to twenty-second embodiments. In FIG. 29, such elements as are found also (i.e. as play the same roles as) in FIG. 1 are identified with the same reference symbols, and their explanations will not be repeated. Now, the configuration shown in FIG. 29 will be described briefly. A P-channel MOS transistor Q1 and a P-channel MOS transistor Q2 are connected to each of output signal lines 6-1, 6-2, . . . , 6-m that are arranged in the column direction. The MOS transistor Q1 has its gate connected to a direct-current voltage line 7, has its drain connected to the output signal line 6-1, and has its source connected to a line 8 of a direct-current voltage VPSA.

Figure 30A:
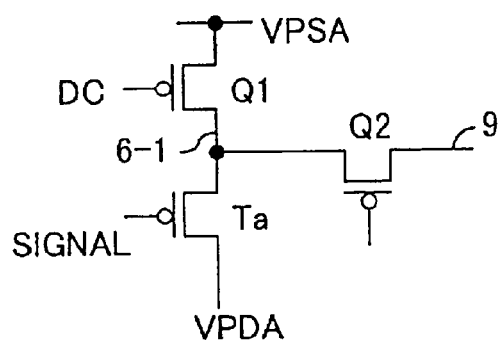
FIGS. 30A and 30B are diagrams showing a portion of FIG. 29.

On the other hand, the MOS transistor Q2 has its drain connected to the output signal line 6-1, has its source connected to a signal line 9 serving as a final destination line, and has its gate connected to a horizontal scanning circuit 3. Here, the MOS transistor Q1, together with a P-channel MOS transistor Ta provided within each pixel, constitutes an amplifier circuit as shown in FIG. 30A. This MOS transistor Ta corresponds to the MOS transistor T4 in the thirteenth to fifteenth, seventeenth to nineteenth, twenty-first, and twenty-second embodiments, and corresponds to the MOS transistor T2 in the twelfth, sixteenth, and twentieth embodiments.

Figure 30B:
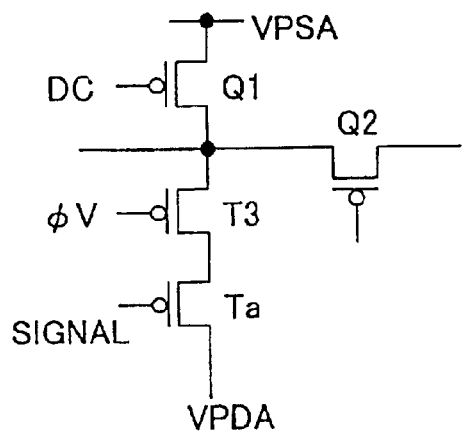

Here, the MOS transistor Q1 serves as a load resistor or constant-current source for the MOS transistor Ta. Thus, the direct-current voltage VPSA connected to the source of this MOS transistor Q1 and the direct-current voltage VPDA connected to the drain of the MOS transistor Ta fulfill the relation VPDA<VPSA, where the direct-current voltage VPDA equals, for example, the ground voltage. The MOS transistor Q1 has its drain connected to the MOS transistor Ta, and receives a direct-current voltage at its gate. The P-channel MOS transistor Q2 is controlled by the horizontal scanning circuit 3 so as to feed the output of the amplifier circuit to the signal line 9 serving as the final destination line. If the MOS transistor T3 provided within each pixel is explicitly illustrated, the circuit shown in FIG. 30A has a circuit configuration as shown in FIG. 30B.

How to Correct Image Signals

Now, with reference to the drawings, an image input apparatus, such as a digital camera, embodying the invention will be described that employs a solid-state image-sensing device having pixels configured according to one of the first to twenty-second embodiments described above.

The image input apparatus shown in FIG. 50 includes the following components. An objective lens 51 introduces the light from a subject into the image input apparatus. A solid-state image-sensing device 52 outputs an electric signal commensurate with the amount of light introduced through the objective lens 51. This solid-state image-sensing device 52 has pixels configured according to one of the first to twenty-second embodiments. A memory 53 receives an image signal from the solid-state image-sensing device 52 and stores it temporarily during an image-sensing operation. Another memory 54 receives a noise signal from the solid-state image-sensing device 52 and stores it temporarily during a resetting operation. A compensation circuit 55 corrects the image signal stored in the memory 53 with the noise signal stored in the memory 54 by performing predetermined compensation calculation. A signal processor 56 performs predetermined processing on the image signal corrected with the noise signal by the compensation circuit 55 and feeds out the processed image signal. A reset circuit 57 performs a resetting operation as described earlier in connection with each of the embodiments, and is provided at least with a power source, and a timing generator and a switch for turning the power source on and off with predetermined timing. Specifically, in the first embodiment, the reset circuit 57 resets the MOS transistor T1 by feeding the signal φVPS to its source; in the ninth embodiment, the reset circuit 57 resets the MOS transistor T8 by feeding the signal φVPG to its gate and the signal φVPD to its drain. It is also possible to configure the vertical or horizontal scanning circuit in such a way as to function also as the reset circuit 57.

This image input apparatus configured as described above operates as follows. First, an image-sensing operation is performed in each pixel and image signals are output pixel by pixel from the solid-state image-sensing device 52 to the memory 53. On completion of the image-sensing operation, each pixel then performs a resetting operation, and meanwhile, as described earlier, variations in sensitivity among the individual pixels are detected and output, as noise signals, to the memory 54. The image signals from the individual pixels stored in the memory 53 and the noise signals from the individual pixels stored in the memory 54 are fed pixel by pixel to the compensation circuit 55.

The compensation circuit 55 corrects the image signals fed from the memory 53 with the noise signals fed from the memory 54 by performing predetermined compensation calculation between the image signals and noise signals of corresponding pixels. The image signals thus corrected are fed to the signal processor 56, which performs predetermined processing on those image signals and then feeds them out. As the memories 53 and 54, line memories or the like are used that can store the signals that are output row by row from the solid-state image-sensing device 52. Thus, these memories 53 and 54 can easily be incorporated into the solid-state image-sensing device.

According to the present invention, in a solid-state image-sensing device, it is possible to switch between linear conversion and logarithmic conversion automatically according to the amount of incident light. Thus, when the subject is dim and the amount of incident light is small, linear conversion is performed, and therefore no afterimage remains in the signals obtained after a resetting operation. By contrast, when the subject is bright and the amount of incident light is large, logarithmic conversion is performed, and therefore it is possible to obtain output signals with a wide dynamic range. Moreover, it is possible to make a switching from linear conversion to logarithmic conversion take place substantially at the same brightness in all the pixels. Moreover, by varying the voltage of a pulse signal fed to transistors, it is possible to vary the brightness at which a switching from linear conversion to logarithmic conversion takes place. Furthermore, by providing sampling circuits, it is possible to sample output signals simultaneously in all the pixels in an image-sensing operation. This makes it possible to sense a fast-moving subject with no distortion in the image obtained.

What is claimed is:

1. A solid-state image-sensing device comprising:
  a light-sensing element that produces an electric signal commensurate with an amount of light incident thereon;
  a transistor of which a first electrode and a control electrode are connected to one electrode of the light-sensing element; and
  a resetting portion for resetting the transistor by feeding a predetermined pulse signal to a second electrode of the transistor,
  wherein the resetting portion resets the transistor in such a way as to inhibit the transistor from operating in a subthreshold region when the amount of light incident on the light-sensing element is below a predetermined level.

2. A solid-state image-sensing device comprising:
  a light-sensing element that produces an electric signal commensurate with an amount of light incident thereon;
  a transistor of which a first electrode and a control electrode are connected to one electrode of the light-sensing element; and
  a resetting portion for resetting the transistor by feeding a predetermined pulse signal to a second electrode of the transistor,
  wherein the resetting portion resets the transistor in such a way as to permit the transistor to operate in a subthreshold region when the amount of light incident on the light-sensing element is equal to or above a predetermined level.

3. A solid-state image-sensing device comprising:
  a light-sensing element that produces an electric signal commensurate with an amount of light incident thereon;
  a transistor of which a first electrode and a control electrode are connected to one electrode of the light-sensing element; and
  a resetting portion for resetting the transistor by feeding a predetermined pulse signal to a second electrode of the transistor,
  wherein the resetting portion resets the transistor in such a way as to keep the transistor in a cut-off state when the amount of light incident on the light-sensing element is below a predetermined level and permit the transistor to operate in a subthreshold region when the amount of light incident on the light-sensing element is equal to or above the predetermined level.

4. A solid-state image-sensing device comprising:
  a light-sensing element that produces an electric signal commensurate with an amount of light incident thereon;
  a transistor of which a first electrode and a control electrode are connected to one electrode of the light-sensing element; and
  a resetting portion for resetting the transistor by feeding a predetermined pulse signal to a second electrode of the transistor,
  wherein the resetting portion resets the transistor in such a way as to
    keep the transistor in a cut-off state when the amount of light incident on the light-sensing element is below a predetermined level so that an output linearly proportional to the amount of light incident on the light-sensing element appears at the control electrode of the transistor and
    permit the transistor to operate in a subthreshold region when the amount of light incident on the light-sensing element is equal to or above the predetermined level so that an output logarithmically proportional to the amount of light incident on the light-sensing element appears at the control electrode of the transistor.

5. A solid-state image-sensing device having a plurality of pixels each comprising a light-sensing element that produces an electric signal commensurate with an amount of light incident thereon,
  wherein each pixel further comprises a transistor of which a first electrode and a control electrode are connected to one electrode of the light-sensing element,
  the solid-state image-sensing device further has a resetting portion for resetting the transistor by feeding a predetermined pulse signal to a second electrode of the transistor, and
  the resetting portion resets the transistor in such a way as to
    keep the transistor in a cut-off state when the amount of light incident on the light-sensing element is below a predetermined level so that an output linearly proportional to the amount of light incident on the light-sensing element appears at the control electrode of the transistor and permit the transistor to operate in a subthreshold region when the amount of light incident on the light-sensing element is equal to or above the predetermined level so that an output logarithmically proportional to the amount of light incident on the light-sensing element appears at the control electrode of the transistor.

6. A solid-state image-sensing device as claimed in claim 5, wherein each pixel further comprises an amplifier circuit that amplifies the output appearing at the control electrode of the transistor.

7. A solid-state image-sensing device as claimed in claim 5, wherein each pixel further comprises:
a first sampling circuit that samples a voltage appearing at the control electrode of the transistor;
a first switch of which one end is connected to the sampling circuit; and
a second sampling circuit that is connected to another end of the first switch and that samples the voltage sampled by the first sampling circuit when the first switch is on.

8. A solid-state image-sensing device as claimed in claim 5, wherein each pixel further comprises an integrator circuit that integrates the output appearing at the control electrode of the transistor.

9. A solid-state image-sensing device as claimed in claim 8, wherein each pixel further comprises:
a first switch of which one end is connected to the integrator circuit; and
a sampling circuit that is connected to another end of the first switch and that samples an output of the integrator circuit when the first switch is on.

10. A solid-state image-sensing device as claimed in claim 5, wherein each pixel further comprises a second switch that is connected between the light-sensing element and the first electrode of the transistor, and
the second switch is kept off during resetting, and is kept on during image sensing so as to permit the transistor to operate in a subthreshold region over a whole brightness range so that an output logarithmically proportional to the amount of light incident on the light-sensing element appears at the control electrode of the transistor.

11. A solid-state image-sensing device as claimed in claim 5, wherein the pixels are arranged in a matrix.

12. A solid-state image-sensing device comprising:
a light-sensing element that produces an electric signal commensurate with an amount of light incident thereon;
a transistor of which a second electrode is connected to one electrode of the light-sensing element; and
a resetting portion for resetting the transistor,
wherein the resetting portion resets the transistor by feeding a predetermined second pulse signal to a control electrode of the transistor and a predetermined first pulse signal to a first electrode of the transistor in such a way as to keep the transistor in a cut-off state when the amount of light incident on the light-sensing element is below a predetermined level and permit the transistor to operate in a subthreshold region when the amount of light incident on the light-sensing element is equal to or above the predetermined level.

13. A solid-state image-sensing device comprising:
a light-sensing element that produces an electric signal commensurate with an amount of light incident thereon;
a transistor of which a second electrode is connected to one electrode of the light-sensing element; and
a resetting portion for resetting the transistor,
wherein the resetting portion resets the transistor by feeding a predetermined pulse voltage, in a range in which a potential at the second electrode of the transistor reflects a threshold level of the transistor, to at least the control electrode of the transistor in such a way as to keep the transistor in a cut-off state when the amount of light incident on the light-sensing element is below a predetermined level and permit the transistor to operate in a subthreshold region when the amount of light incident on the light-sensing element is equal to or above the predetermined level.

14. A solid-state image-sensing device having a plurality of pixels each comprising a light-sensing element that produces an electric signal commensurate with an amount of light incident thereon, wherein each pixel further comprises a transistor of which a second electrode is connected to one electrode of the light-sensing element and that receives a first pulse signal having a first voltage at a first electrode thereof and a second pulse signal having a second voltage at a control electrode thereof during resetting,
a voltage at the second electrode of the transistor is reset through the transistor as a result of the first pulse signal being fed to the first electrode of the transistor and the second pulse signal being fed to the control electrode of the transistor, and
the transistor is
kept in a cut-off state when the amount of light incident on the light-sensing element is below a predetermined level so that an output linearly proportional to the amount of light incident on the light-sensing element appears at the second electrode of the transistor and
made to operate in a subthreshold region when the amount of light incident on the light-sensing element is equal to or above the predetermined level so that an output logarithmically proportional to the amount of light incident on the light-sensing element appears at the second electrode of the transistor.

15. A solid-state image-sensing device as claimed in claim 14, wherein each pixel further comprises an amplifier circuit that amplifies the output appearing at the second electrode of the transistor.

16. A solid-state image-sensing device as claimed in claim 15, wherein each pixel further comprises an integrator circuit that integrates the output appearing at the second electrode of the transistor.

17. A solid-state image-sensing device as claimed in claim 14, wherein the pixels are arranged in a matrix.

18. A solid-state image-sensing device having a plurality of pixels,
wherein each pixel comprises:

a photodiode that receives a direct-current voltage at a first electrode thereof, and a first MOS transistor of which a first electrode and a gate electrode are connected to a second electrode of the photodiode and that receives a pulse signal having a predetermined voltage at a second electrode thereof, a voltage at the gate electrode of the first MOS transistor is reset through the first MOS transistor as a result of the pulse signal being fed to the second electrode of the first MOS transistor, and the first MOS transistor is kept in a cut-off state when an amount of light incident on the photodiode is below a predetermined level so that an output linearly proportional to the amount of light incident on the photodiode appears at the gate electrode of the first MOS transistor and made to operate in a subthreshold region when the amount of light incident on the photodiode is equal to or above the predetermined level so that an output logarithmically proportional to the amount of light incident on the photodiode appears at the gate electrode of the first MOS transistor.

19. A solid-state image-sensing device as claimed in claim 18, wherein each pixel further comprises a second MOS transistor of which a gate electrode is connected to the first and gate electrodes of the first MOS transistor, the second MOS transistor outputting an output signal at a second electrode thereof.

20. A solid-state image-sensing device as claimed in claim 19, wherein each pixel further comprises a third MOS transistor of which a first electrode is connected to the second electrode of the second MOS transistor and of which a gate electrode is connected to a row selection line, the third MOS transistor outputting an output signal at a second electrode thereof.

21. A solid-state image-sensing device as claimed in claim 19, wherein each pixel further comprises a first capacitor of which one end is connected to the second electrode of the second MOS transistor and that receives a direct-current voltage at another end thereof.

22. A solid-state image-sensing device as claimed in claim 21, wherein each pixel further comprises a fourth MOS transistor of which a gate electrode is connected to the second electrode of the second MOS transistor and that receives a direct-current voltage at a first electrode thereof.

23. A solid-state image-sensing device as claimed in claim 22, wherein each pixel further comprises a third MOS transistor of which a first electrode is connected to the second electrode of the fourth MOS transistor and of which a gate electrode is connected to a row selection line, the third MOS transistor outputting an output signal at a second electrode thereof.

24. A solid-state image-sensing device as claimed in claim 21, wherein each pixel further comprises:

a fifth MOS transistor of which a first electrode is connected to the one end of the first capacitor;

a second capacitor of which one end is connected to a second electrode of the fifth MOS transistor and that receives a direct-current voltage at another end thereof, and a sixth MOS transistor of which a first electrode is connected to the one end of the second capacitor and that receives a direct-current voltage at a second electrode thereof, the sixth MOS transistor being used to reset the second capacitor, wherein, as the individual pixels perform an image-sensing operation simultaneously, a voltage commensurate with an amount of light incident on the photodiode appears at the one end of the first capacitor, and, by turning on the fifth MOS transistor of the individual pixels simultaneously, the voltage that has appeared at the one end of the first capacitor is sampled by the second capacitor.

25. A solid-state image-sensing device as claimed in claim 24, wherein each pixel further comprises a fourth MOS transistor of which a gate electrode is connected to the one end of the second capacitor and that receives a direct-current voltage at a first electrode thereof.

26. A solid-state image-sensing device as claimed in claim 25, wherein each pixel further comprises a third MOS transistor of which a first electrode is connected to the second electrode of the fourth MOS transistor and of which a gate electrode is connected to a row selection line, the third MOS transistor outputting an output signal at a second electrode thereof.

27. A solid-state image-sensing device as claimed in claim 18, wherein each pixel further comprises a first capacitor of which one end is connected to the first and gate electrodes of the first MOS transistor and that receives a direct-current voltage at another end thereof.

28. A solid-state image-sensing device as claimed in claim 27, wherein each pixel further comprises:

a fifth MOS transistor of which a first electrode is connected to the one end of the first capacitor;

a second capacitor of which one end is connected to a second electrode of the fifth MOS transistor and that receives a direct-current voltage at another end thereof, and a sixth MOS transistor of which a first electrode is connected to the one end of the second capacitor and that receives a direct-current voltage at a second electrode thereof, the sixth MOS transistor being used to reset the second capacitor, wherein, as the individual pixels perform an image-sensing operation simultaneously, a voltage commensurate with an amount of light incident on the photodiode appears at the one end of the first capacitor, and, by turning on the fifth MOS transistor of the individual pixels simultaneously, the voltage that has appeared at the one end of the first capacitor is sampled by the second capacitor.

29. A solid-state image-sensing device as claimed in claim 28, wherein each pixel further comprises a fourth MOS transistor of which a gate electrode is connected to the one end of the second capacitor and that receives a direct-current voltage at a first electrode thereof.

30. A solid-state image-sensing device as claimed in claim 29, wherein each pixel further comprises a third MOS transistor of which a first electrode is connected to the second electrode of the fourth MOS transistor and of which a gate electrode is connected to a row selection line, the third MOS transistor outputting an output signal at a second electrode thereof.

31. A solid-state image-sensing device as claimed in claim 18, wherein each pixel further comprises a seventh MOS transistor of which a first electrode is connected to the second electrode of the photodiode and of which a second electrode is connected to the first and gate electrodes of the first MOS transistor, and the seventh MOS transistor is kept off during resetting, and is kept on during image sensing so as to permit the first MOS transistor to operate in a subthreshold region over a whole brightness range so that an output logarithmically proportional to the amount of light incident on the photodiode appears at the gate electrode of the first MOS transistor.

32. A solid-state image-sensing device as claimed in claim 18, wherein the pixels are arranged in a matrix.

33. A solid-state image-sensing device having a plurality of pixels, wherein each pixel comprises:
a photodiode that receives a direct-current voltage at a second electrode thereof, and
a first MOS transistor of which a second electrode is connected to a first electrode of the photo diode and that receives a first pulse signal having a first voltage at a first electrode thereof and a second pulse signal having a second voltage at a gate electrode thereof, a voltage at the second electrode of the first MOS transistor is reset through the first MOS transistor as a result of the first pulse signal being fed to the first electrode of the first MOS transistor and then the second pulse signal being fed to the gate electrode of the first MOS transistor, and the first MOS transistor is
kept in a cut-off state when an amount of light incident on the photodiode is below a predetermined level so that an output linearly proportional to the amount of light incident on the photodiode appears at the second electrode of the first MOS transistor and made to operate in a subthreshold region when the amount of light incident on the photodiode is equal to or above the predetermined level so that an output logarithmically proportional to the amount of light incident on the photodiode appears at the second electrode of the first MOS transistor.

34. A solid-state image-sensing device as claimed in claim 33, wherein each pixel further comprises a second MOS transistor of which a gate electrode is connected to the second electrode of the first MOS transistor, the second MOS transistor outputting an output signal at a second electrode thereof.

35. A solid-state image-sensing device as claimed in claim 34, wherein each pixel further comprises a third MOS transistor of which a first electrode is connected to the second electrode of the second MOS transistor and of which a gate electrode is connected to a row selection line, the third MOS transistor outputting an output signal at a second electrode thereof.

36. A solid-state image-sensing device as claimed in claim 34, wherein each pixel further comprises a first capacitor of which one end is connected to the second electrode of the second MOS transistor and that receives a direct-current voltage at another end thereof.

37. A solid-state image-sensing device as claimed in claim 36, wherein each pixel further comprises a fourth MOS transistor of which a gate electrode is connected to the second electrode of the second MOS transistor and that receives a direct-current voltage at a first electrode thereof.

38. A solid-state image-sensing device as claimed in claim 37, wherein the second MOS transistor is a MOS transistor of an opposite polarity type to the first MOS transistor.

39. A solid-state image-sensing device as claimed in claim 37, wherein each pixel further comprises a third MOS transistor of which a first electrode is connected to the second electrode of the fourth MOS transistor and of which a gate electrode is connected to a row selection line, the third MOS transistor outputting an output signal at a second electrode thereof.

40. A solid-state image-sensing device as claimed in claim 39, wherein the second MOS transistor is a MOS transistor of an opposite polarity type to the first MOS transistor.

41. A solid-state image-sensing device as claimed in claim 33, wherein the pixels are arranged in a matrix.

* * * * *